(12) United States Patent
Choi et al.

(10) Patent No.: US 9,490,126 B2
(45) Date of Patent: Nov. 8, 2016

(54) RESISTIVE MEMORY ARRAY USING P-I-N DIODE SELECT DEVICE AND METHODS OF FABRICATION THEREOF

(75) Inventors: Seungmoo Choi, Newport Beach, CA (US); Sameer Haddad, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/165,652

(22) Filed: Jun. 21, 2011

(65) Prior Publication Data

US 2011/0253968 A1    Oct. 20, 2011

Related U.S. Application Data

(62) Division of application No. 11/641,646, filed on Dec. 19, 2006, now Pat. No. 7,989,328.

(51) Int. Cl.
| | |
|---|---|
| *H01L 29/868* | (2006.01) |
| *H01L 21/225* | (2006.01) |
| *H01L 29/66* | (2006.01) |
| *G11C 17/06* | (2006.01) |
| *H01L 27/24* | (2006.01) |

(52) U.S. Cl.
CPC ....... *H01L 21/2256* (2013.01); *H01L 29/6609* (2013.01); *H01L 29/868* (2013.01); *G11C 17/06* (2013.01); *H01L 27/24* (2013.01)

(58) Field of Classification Search
CPC .......... H01L 21/2256; H01L 29/6609; H01L 29/868; H01L 27/24
USPC ................. 438/328, 542; 257/656, E21.135, 257/E29.336
See application file for complete search history.

(56) References Cited

U.S. PATENT DOCUMENTS

| | | | |
|---|---|---|---|
| 5,051,789 A | 9/1991 | Rosen et al. | |
| 5,225,706 A * | 7/1993 | Berger et al. | 257/446 |
| 6,451,702 B1 | 9/2002 | Yang et al. | |
| 6,570,795 B1 * | 5/2003 | Fricke et al. | 365/200 |
| 6,936,895 B2 | 8/2005 | Manna et al. | |
| 7,468,296 B1 | 12/2008 | Adem et al. | |
| 7,525,170 B2 * | 4/2009 | Hsu et al. | 257/458 |
| 2005/0173776 A1 | 8/2005 | Dalen et al. | |
| 2006/0076598 A1* | 4/2006 | Higashi et al. | 257/296 |
| 2007/0222015 A1 | 9/2007 | Cheng et al. | |
| 2008/0019257 A1 | 1/2008 | Philipp et al. | |

OTHER PUBLICATIONS

USPTO Final Rejection for U.S. Appl. No. 11/641,646 dated Jul. 21, 2010; 12 pages.
USPTO Non Final Rejection for U.S. Appl. No. 11/641,646 dated Feb. 1, 2010; 14 pages.
USPTO Non Final Rejection for U.S. Appl. No. 11/641,646 dated Jul.8, 2009; 10 pages.

(Continued)

*Primary Examiner* — Jae Lee
*Assistant Examiner* — Colleen E Snow

(57) ABSTRACT

An electronic structure includes a resistive memory device, and a P-I-N diode in operative association with the resistive memory device. A plurality of such electronic structures are used in a resistive memory array, with the P-I-N diodes functioning as select devices in the array. Methods are provided for fabricating such resistive memory device—P-I-N diode structures.

12 Claims, 27 Drawing Sheets

(56) References Cited

OTHER PUBLICATIONS

USPTO Notice of Allowance for U.S. Appl. No. 11/641,646 dated Jun. 1, 2011; 8 pages.

USPTO Requirement for Restriction for U.S. Appl. No. 11/641,646 dated May 20, 2009; 6 pages.

* cited by examiner

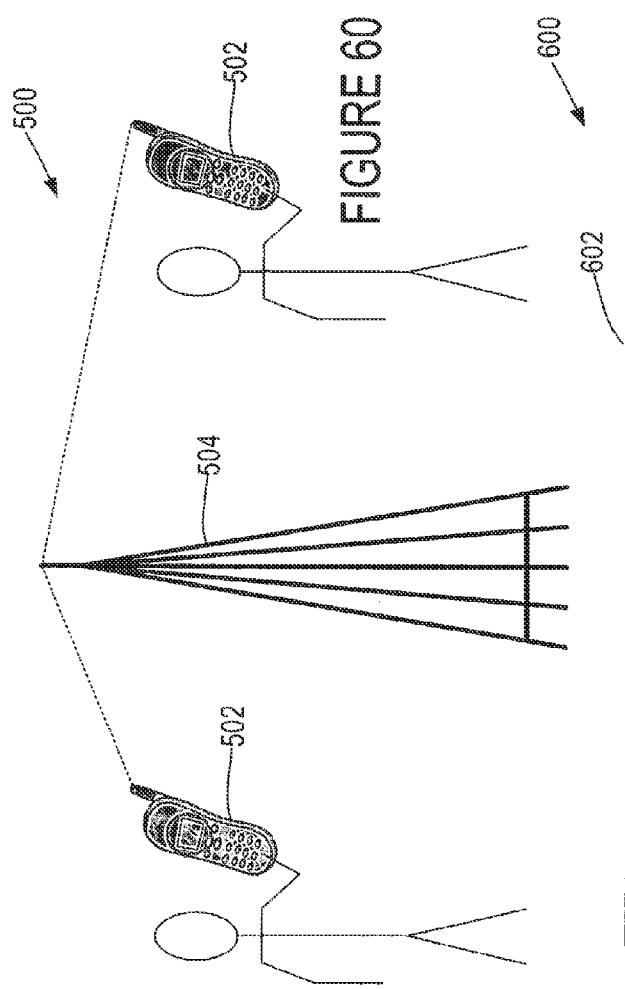
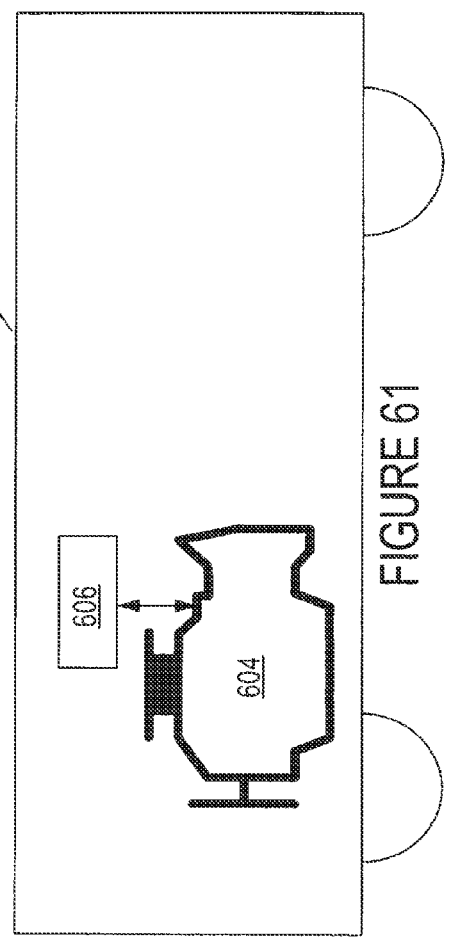
FIGURE 60
FIGURE 61

RESISTIVE MEMORY ARRAY USING P-I-N DIODE SELECT DEVICE AND METHODS OF FABRICATION THEREOF

CROSS-REFERENCES TO RELATED APPLICATIONS

This application is a Divisional application of and claims priority to U.S. application Ser. No. 11/641,646, filed Dec. 19, 2006, which is hereby incorporated in its entirety.

BACKGROUND OF THE INVENTION

1. Technical Field

This invention relates generally to resistive memory arrays, and more particularly, to fabrication and use of P-I-N diodes as part of the array.

2. Background Art

FIG. 1 illustrates a resistive memory array 60. The array 60 includes a first plurality of parallel conductors 62 (bit lines) BL0, BL1, and a second plurality of parallel conductors 64 (word lines) WL0, WL1, ... WLn overlying and spaced from, orthogonal to, and crossing the first plurality of conductors 62. A plurality of memory structures 66 are included in the array. Each memory structure 66 includes a resistive memory cell 68 and a diode 70 in series therewith connecting a conductor WL of the plurality thereof with a conductor BL of the plurality thereof at the intersection of those conductors, with the diode 70 in a forward direction from the conductor WL to the conductor BL. For example, as shown in FIG. 1, in the memory structure $66_{00}$, resistive memory cell $68_{00}$ and diode $70_{00}$ connect in series WL0 with BL0; in the memory structure $66_{01}$, resistive memory cell $68_{01}$ and diode $70_{01}$ connect in series connect WL1 with BL0, etc.

The diodes 70 have the conventional PN configuration shown in FIGS. 2 and 3, including a P+ region in contact with an N+ region. As is well known, a diode of this type, having a relatively low forward threshold voltage, readily conducts current in the forward direction upon application of forward potential thereto (FIG. 2), but having a relatively high reverse breakdown voltage, does not conduct substantial current upon application of reverse potential thereto (FIG. 3).

Because of this characteristic, these diodes 70 (oriented as shown in FIGS. 1, 4 and 5) are used as select devices in the array 60 of FIG. 1. FIGS. 1, 4 and 5 illustrate this utility.

FIG. 1 illustrates the programming of a selected resistive memory cell $68_{00}$ of the array 60. In such programming, $V_{pg}$ is applied to word line WL0, and 0V is applied to bit line BL0 and word lines WL1 ... WLn. Meanwhile, $V_{pg}$ is applied to bit lines BL1 ... BLn. This causes a voltage $V_{pg}$ to be applied across the memory structure $66_{00}$, in the forward direction from the word line WL0 to the bit line BL0, sufficient to program the resistive memory cell $68_{00}$. All other resistive memory cells connected to the word line WL0 and bit line BL0 have 0V potential thereacross. Meanwhile, all the other resistive memory cells of the array 60 have $V_{pg}$ applied thereacross in the reverse direction of the diode 70, with $V_{pg}$ applied thereto being less than the reverse breakdown voltage of the diode 70. In this way, the diodes throughout the array 60 act as select devices to ensure that only the selected resistive memory cell is programmed and that the other resistive memory cells of the array are undisturbed.

FIG. 4 illustrates the erasing of the selected resistive memory cell $68_{00}$ of the array 60. In such erasing, $V_{er}$ (lower voltage than $V_{pg}$) is applied to word line WL0, and 0V is applied to bit line BL0 and word lines WL1 ... WLn. Meanwhile, $V_{er}$ is applied to bit lines BL1 ... BLn. This causes a voltage $V_{er}$ to be applied across the memory structure $66_{00}$, in the forward direction from the word line WL0 to the bit line BL0, which (along with increased current applied through the resistive memory cell $68_{00}$ as compared to programming current) is sufficient to erase the resistive memory cell $68_{00}$. All other resistive memory cells connected to the word line WL0 and bit line BL0 have 0V potential thereacross. Meanwhile, all the other resistive memory cells of the array 60 have $V_{er}$ applied thereacross in the reverse direction of the diode 70, with $V_{er}$ applied thereto being less than the reverse breakdown voltage of the diode. In this way, the diodes throughout the array 60 act as select devices to ensure that only the selected resistive memory cell is erased and that the other resistive memory cells of the array are undisturbed.

FIG. 5 illustrates the reading of the selected resistive memory cell 68 of the array 60. In such reading, $V_r$ (lower voltage than $V_{er}$) is applied to word line WL0, and 0V is applied to bit line BL0 and word lines WL1 ... WLn. Meanwhile, $V_r$ is applied to bit lines BL1 ... BLn. This causes a voltage $V_r$ to be applied across the memory structure $66_{00}$, in the forward direction from the word line WL0 to the bit line BL0, sufficient to read the state of the resistive memory cell $68_{00}$. All other resistive memory cells connected to the word line WL0 and bit line BL0 have 0V potential thereacross. Meanwhile, all the other resistive memory cells of the array 60 have $V_r$ applied thereacross in the reverse direction of the diode 70, with $V_r$ applied thereto being less than the reverse breakdown voltage of the diode. In this way, the diodes throughout the array 60 act as select devices to ensure that only the selected resistive memory cell is read and that the other resistive memory cells of the array are undisturbed.

While such an approach is useful, it will be understood that diodes of this type may exhibit an undesirable degree of current leakage, potentially resulting in undesired disturbing of other cells, along with a high level of power consumption. Meanwhile, it will be understood diodes used as select devices should provide high driving capability. What is needed is an approach wherein select devices in a resistive memory array exhibit very low current leakage along with high driving capability. What is further needed are methods for fabricating structures which are capable of providing these features, which methods are simple and efficient.

DISCLOSURE OF THE INVENTION

Broadly stated, the present method of forming a region of a P-I-N diode comprises providing a semiconductor body, providing a doped body adjacent the semiconductor body, the doped body containing a dopant of a selected conductivity type, and diffusing dopant of the selected conductivity type from the doped body into the semiconductor body to form a region of the selected conductivity type in the semiconductor body, the region of the selected conductivity type in the semiconductor body making up part of a P-I-N diode.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

FIGS. 60-62 illustrate systems using devices of the previous embodiments.

BEST MODE(S) FOR CARRYING OUT THE INVENTION

Reference is now made in detail to specific embodiments of the present invention which illustrate the best mode presently contemplated by the inventors for practicing the invention.

Figure 1:
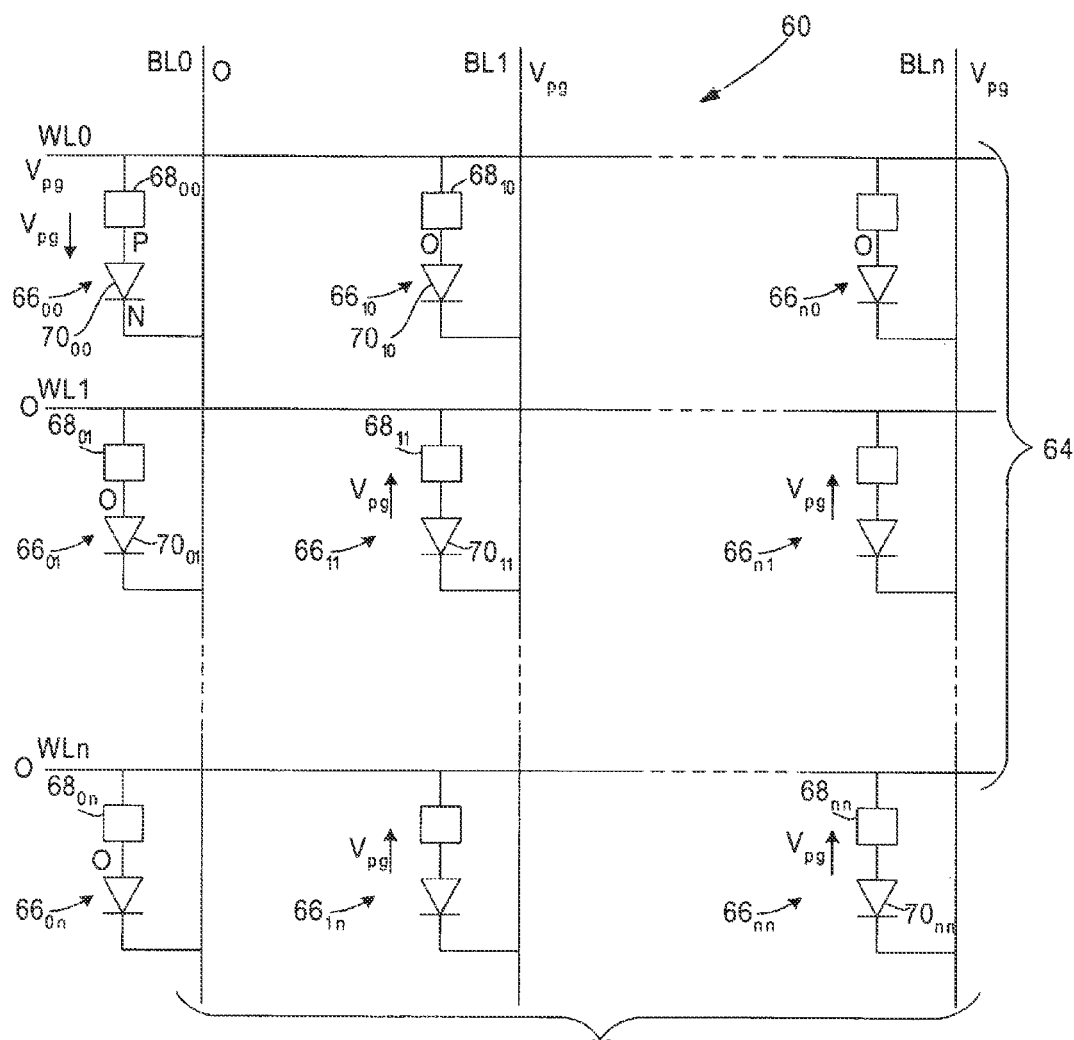
FIG. 1 illustrates programming of a resistive memory cell of a prior art resistive memory array.
Figure 2:
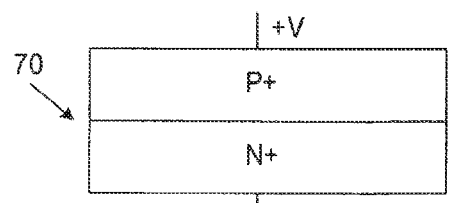
FIGS. 2 and 3 illustrate a prior art diode as used in the array of FIG. 1.
Figure 3:
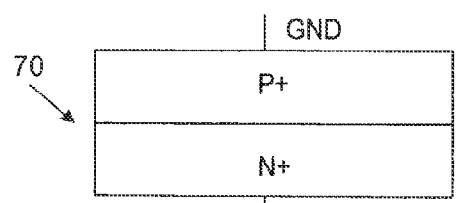
Figure 4:
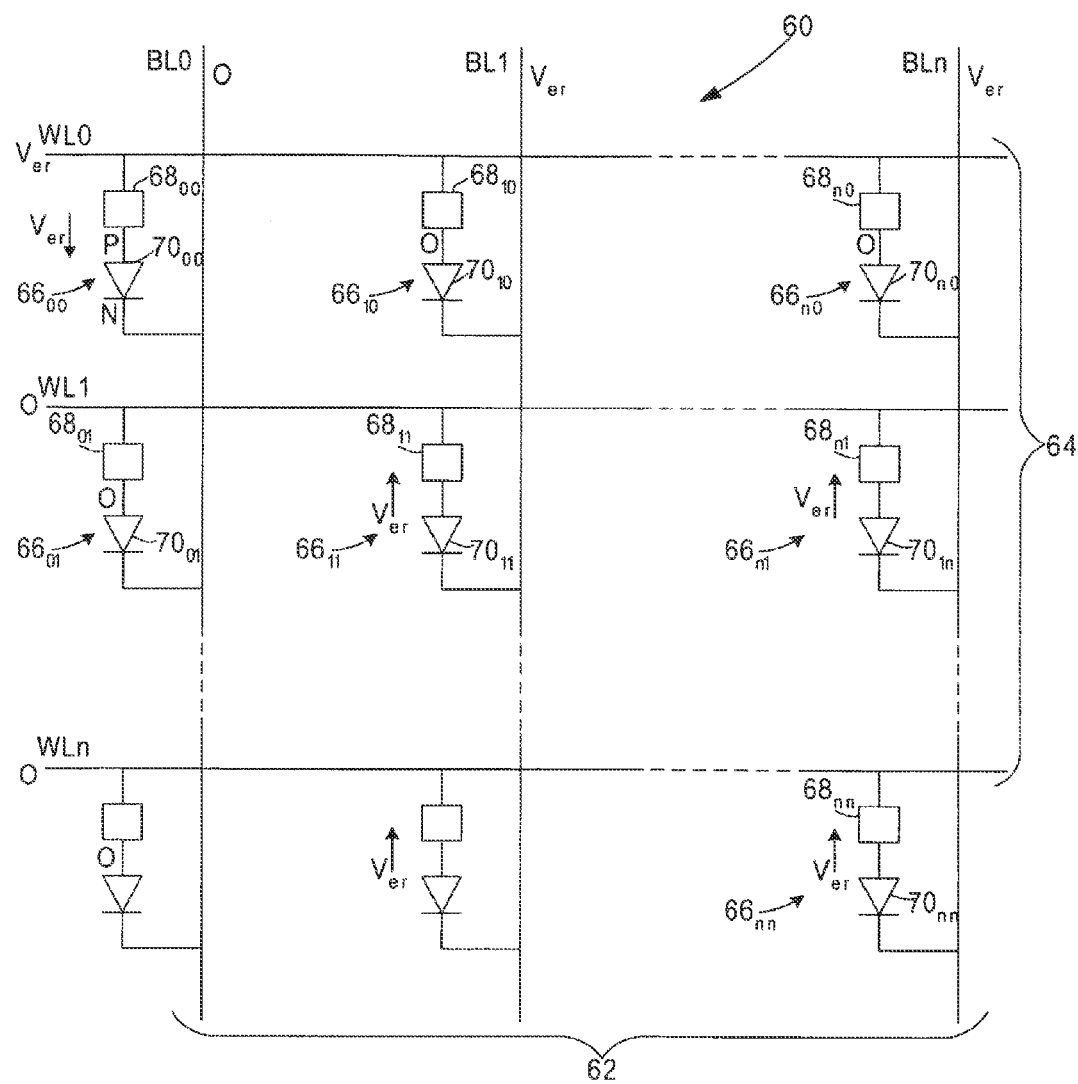
FIG. 4 illustrates erasing of a resistive memory cell of the resistive memory array of FIG. 1.
Figure 5:
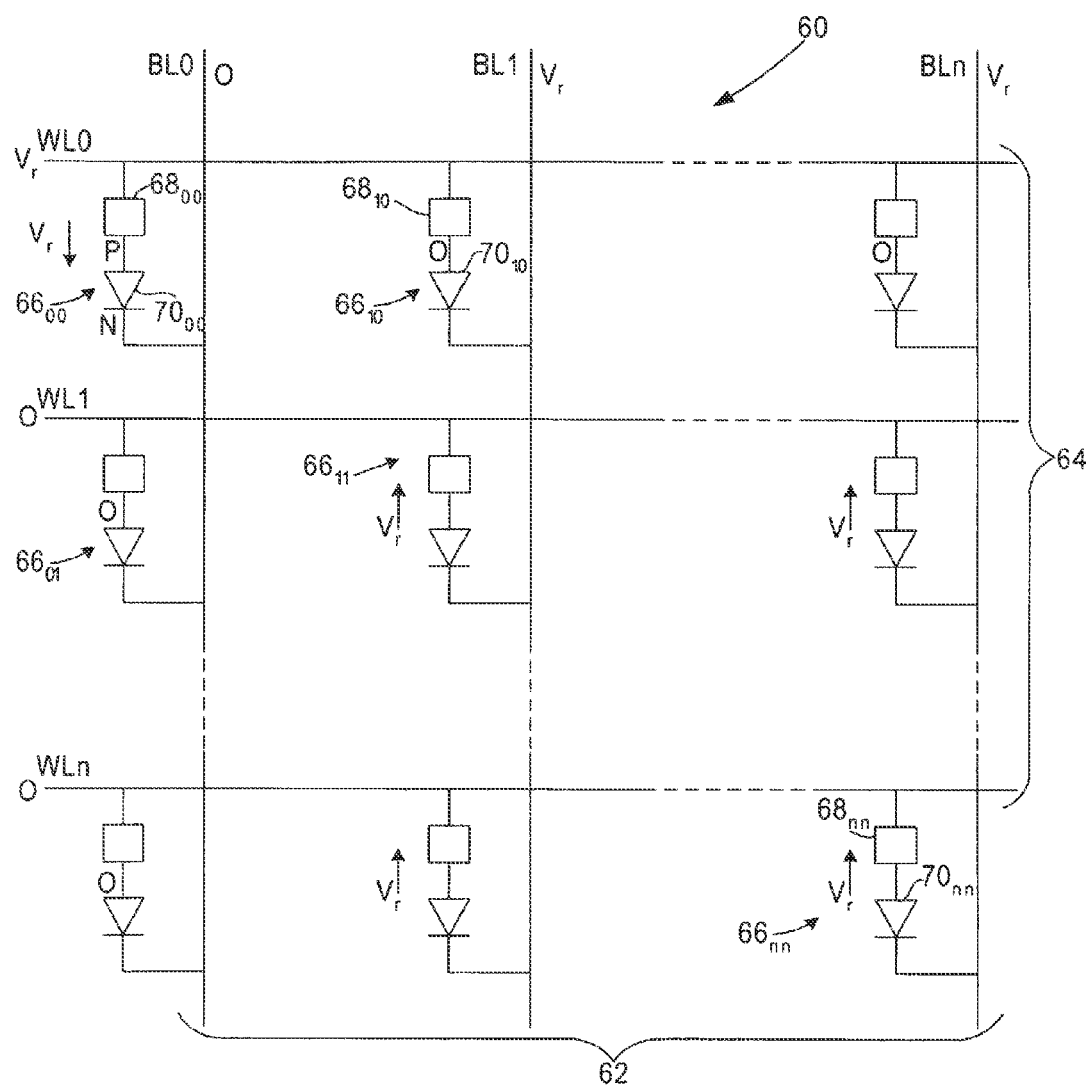
FIG. 5 illustrates reading of a resistive memory cell of the resistive memory array of FIG. 1.
Figure 6:
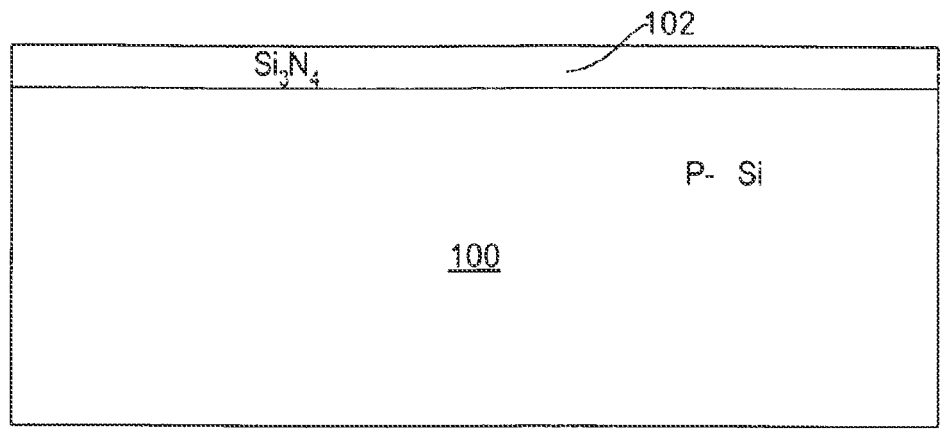
FIGS. 6-23 illustrate method steps in fabricating a first embodiment of diode and resistive memory device in accordance with the present invention.
Figure 7:
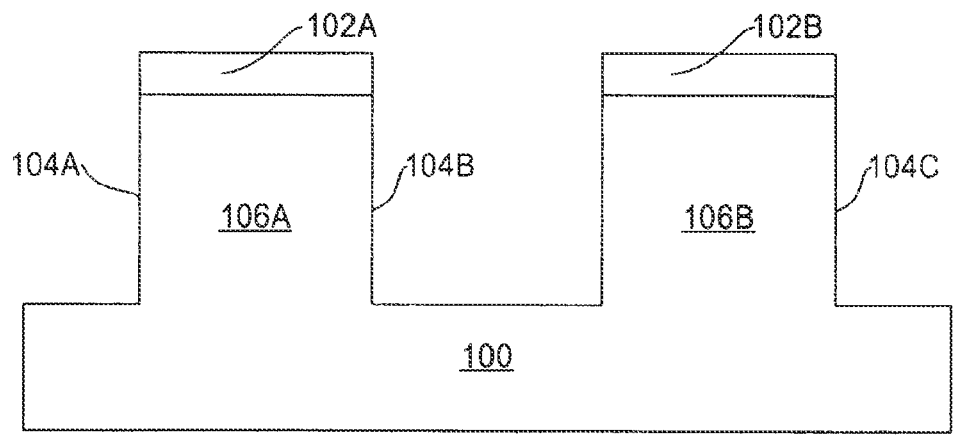
Figure 8:
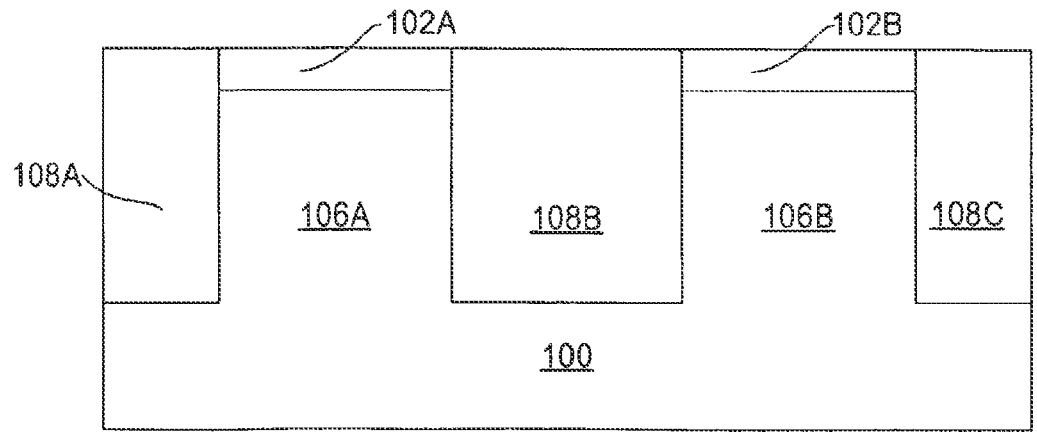
Figure 9:
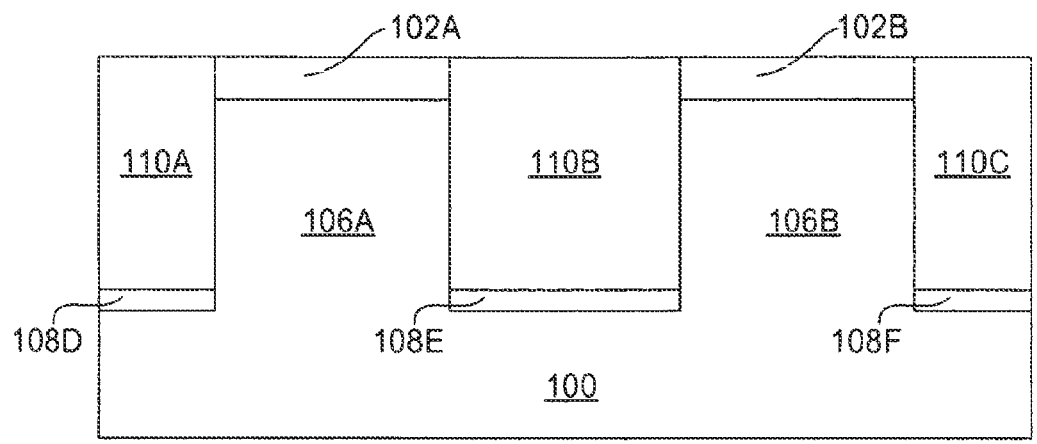

Referring to FIG. 6, a monocrystalline P− silicon semiconductor substrate 100 is provided. A silicon nitride ($Si_3N_4$) layer 102 is deposited thereon, and using standard photolithographic techniques, silicon nitride strips 102A, 102B (running perpendicular to the plane of the drawing of FIG. 6) are formed. Using the silicon nitride strips 102A, 102B as a mask, the semiconductor substrate 100 is etched to form openings 104A, 104B, 104C therein and to define elongated silicon semiconductor strips 106A, 106B (FIG. 7). Next (FIG. 8), a High Density Plasma (HDP) undoped oxide 108A, 108B, 108C is deposited in the openings 104A, 104B, 104C, and a chemical mechanical polish (CMP) is undertaken to planarize the top surface of the resulting structure. Referring to FIG. 9, a substantial portion of the HDP oxide 108A, 108B, 108C is removed by etching from each of the openings 104A, 104B, 104C, leaving a smaller portion of HDP oxide 108D, 108E, 108F at the bottom thereof. Then, an N+, for example phosphorus doped oxide 110A, 110B, 110C is deposited in each of the remaining openings 104A, 104B, 104C, and a chemical mechanical polish is undertaken to planarize the top surface of the resulting structure.

Figure 10:
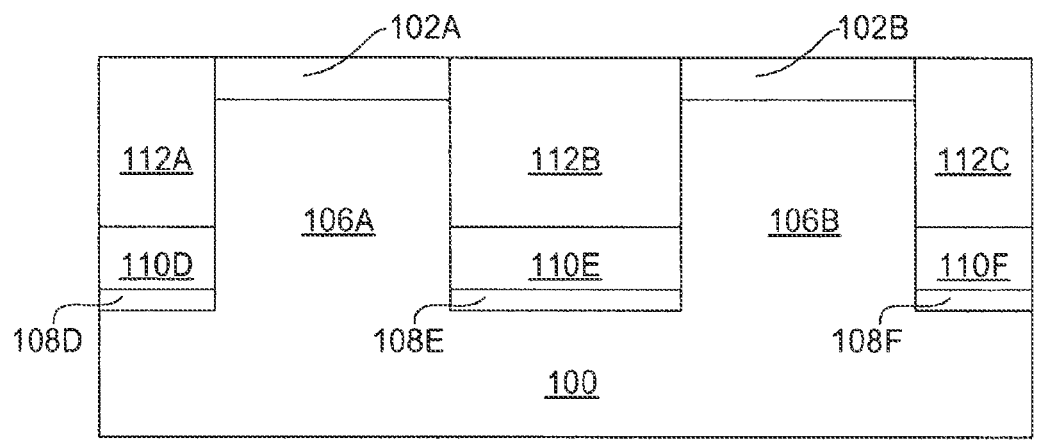

Referring to FIG. 10, a portion of the phosphorus doped oxide 110A, 110B, 110C is removed from each of the openings 104A, 104B, 104C, leaving smaller portions 110D, 110E, 110F thereof in each of the openings 104A, 104B, 104C on the remaining HDP oxide portions 108D, 108E, 108F respectively. HDP (undoped) oxide 112A, 112B, 112C is then deposited in the openings 104A, 104B, 104C, and a chemical mechanical polish is undertaken to planarize the top surface of the resulting structure.

Figure 11:
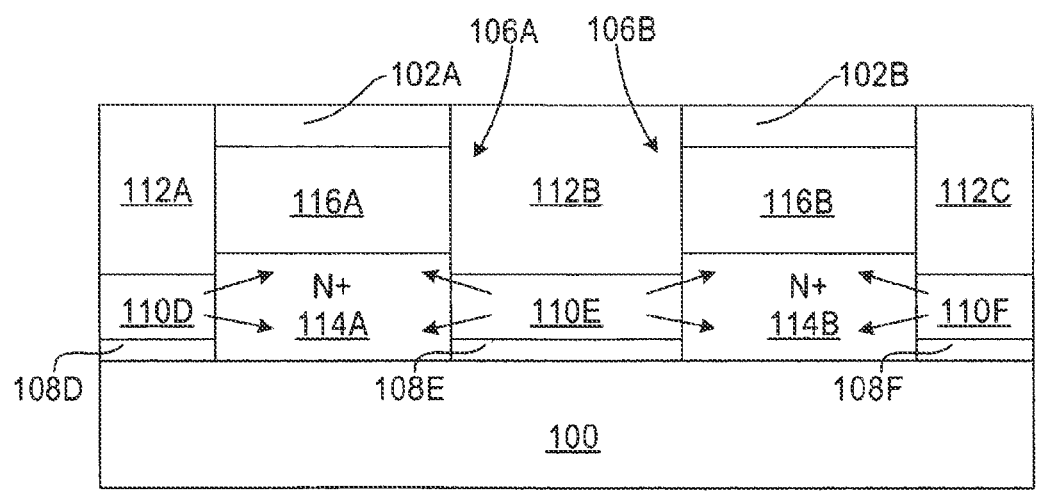

Then, high temperature is applied to the resulting structure, causing phosphorus dopant simultaneously diffuse from each of the phosphorus doped oxide portions 110D, 110E, 110F into the adjacent silicon strips 106A, 106B on opposite sides thereof. That is, as will be seen in FIG. 11, dopant simultaneously flows and diffuses from the portion 110E between the silicon strips 106A, 106B into both of those silicon strips 106A, 106B. Likewise, dopant simultaneously flows and diffuses from the portion 110D into the silicon strip 106A and into the silicon strip on the opposite side thereof (not shown), and simultaneously dopant flows and diffuses from the portion 110F into the silicon strip 106B and into the silicon strip on the opposite side thereof (not shown). In this way, N+ regions 114A, 114B are formed in the silicon strips 106A, 106B, extending across the strips, with intrinsic regions 116A, 116B respectively thereover.

Figure 12:
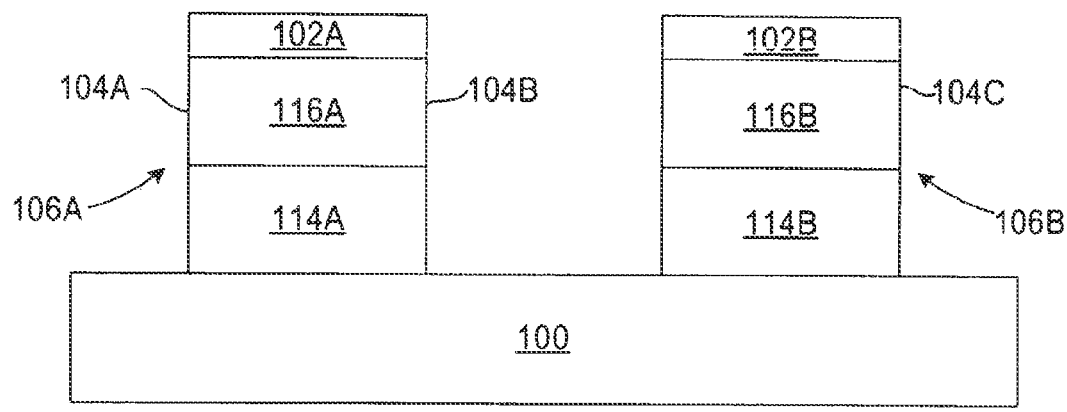
Figure 13:
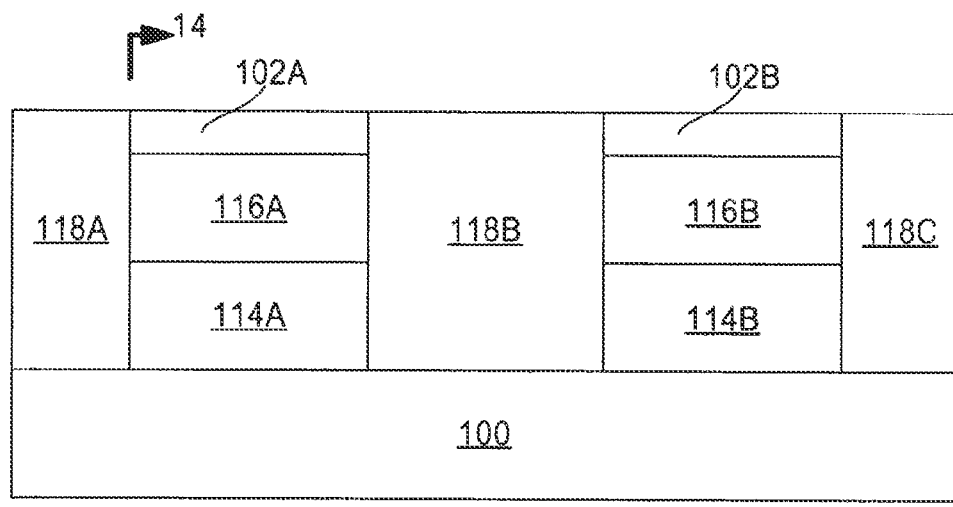
Figure 14:
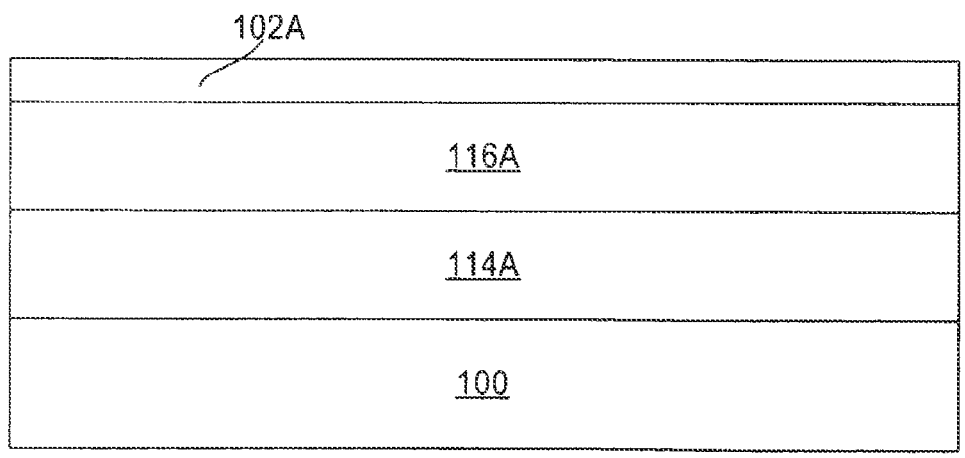

Next, all material is removed from between the silicon strips (FIG. 12), HDP (undoped) oxide 118A, 118B, 118C is deposited in the openings 104A, 104B, 104C (FIG. 13), and a chemical-mechanical polish is undertaken. FIG. 14 shows the resulting structure as viewed along the line 14-14 of FIG. 13.

Figure 15:
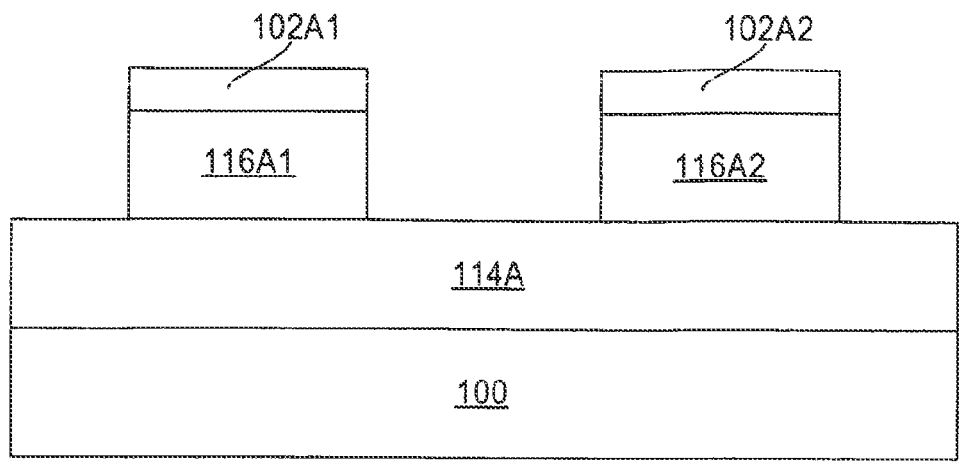
Figure 16:
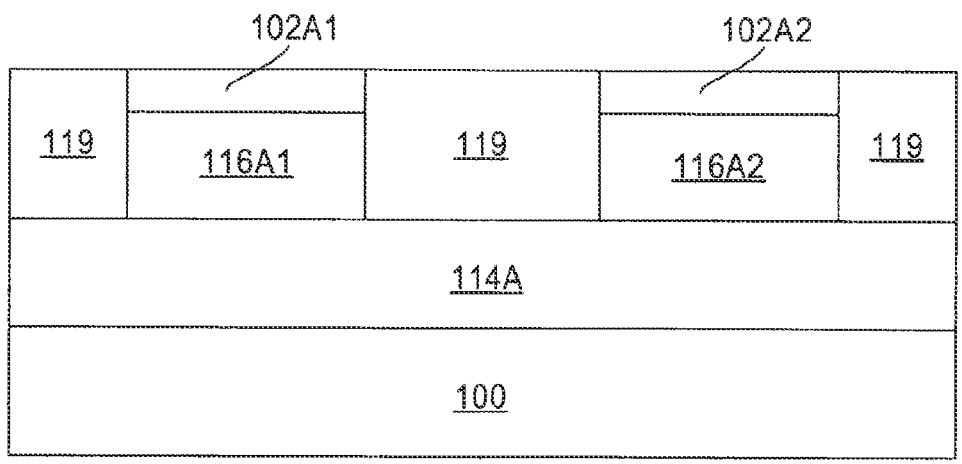

Using standard photolithographic masking and etching techniques, the silicon nitride layer 102A is patterned as shown in FIG. 15, forming rectangular silicon nitride bodies 102A1, 102A2, and an etching step is undertaken to etch away the unmasked portions of silicon down to the N+ region 114A to form pillars 116A1, 116A2 of silicon material. Openings are filled with undoped HDP oxide 119 (FIG. 16), and a chemical-mechanical polish is undertaken. Next, the silicon nitride 102A1, 102A2 (and portions of the exposed HDP oxide 119) are removed, and an ion implant is undertaken, implanting for example boron into the exposed portions of the silicon pillars 116A1, 116A2, to simultaneously form P+ regions 120A, 120B therein, to a depth so that in each pillar, there is defined an intrinsic region between the P+ region thereof and the N+ region (intrinsic region 121A between P+ regions 120A and N+ region 114A; intrinsic region 121B between P+ region 120B and N+ region 114A, FIG. 17). An activation step is than undertaken.

Figure 17:
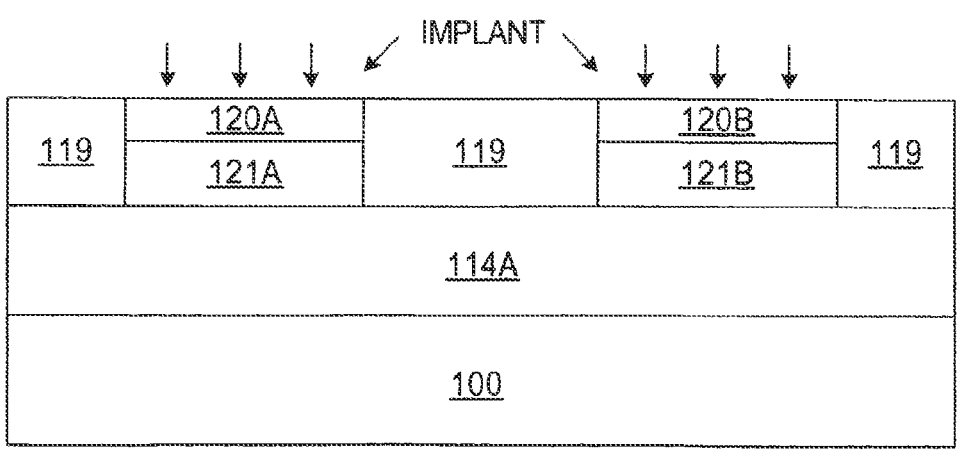
Figure 18:
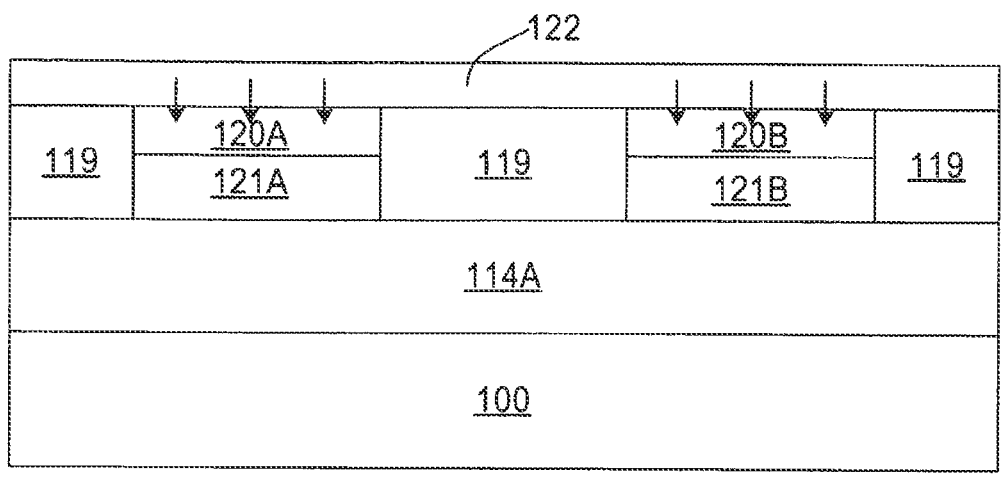
Figure 19:
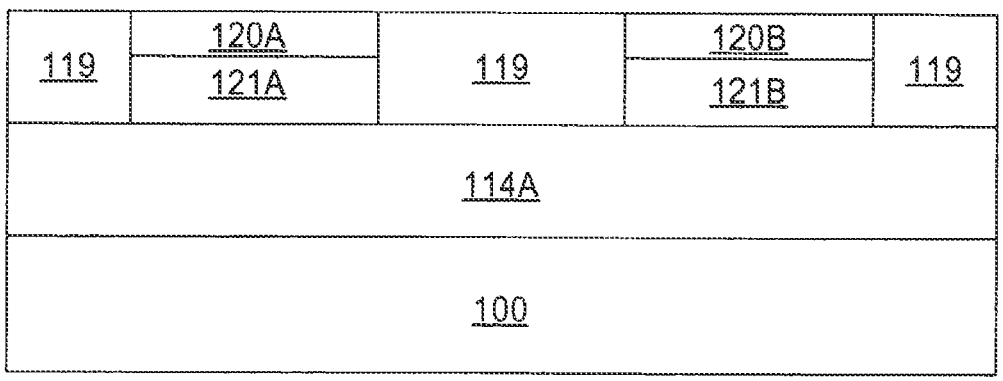

As an alternative, instead of implanting dopant into the pillars to form the P+ regions, a layer of P+ (for example boron) doped oxide 122 may be deposited over the structure of FIG. 17 prior to implant, with a high temperature step being undertaken to simultaneously diffuse dopant from the oxide layer 122 into the pillars 116A1, 116A2 to form the P+ regions (FIG. 19). The layer 122 is then removed and an activation step is undertaken.

Figure 20:
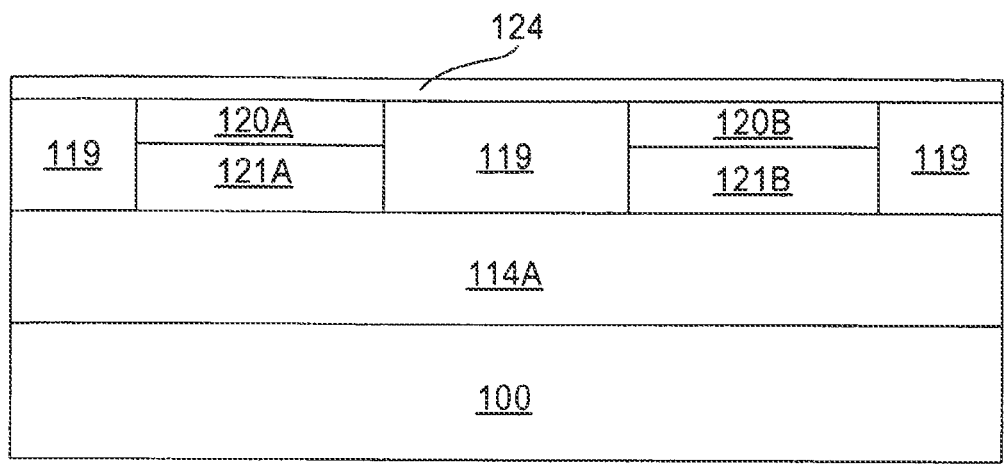
Figure 21:
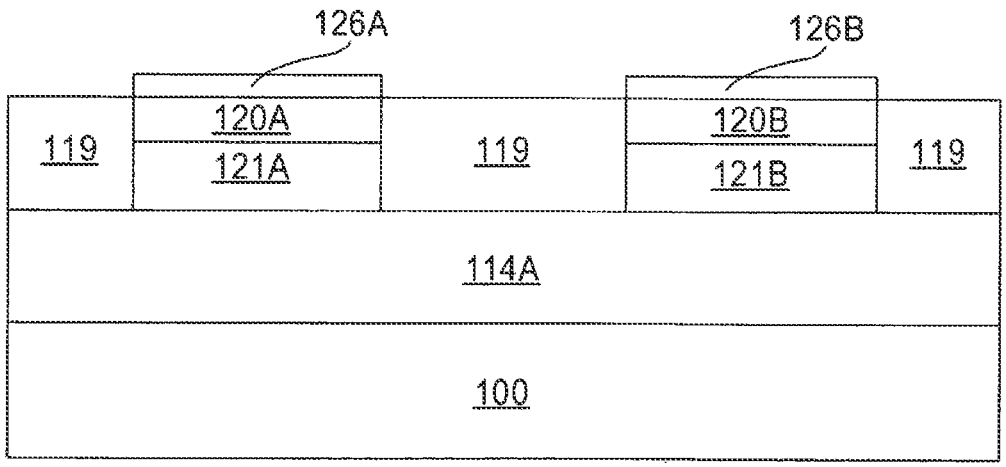
Figure 22:
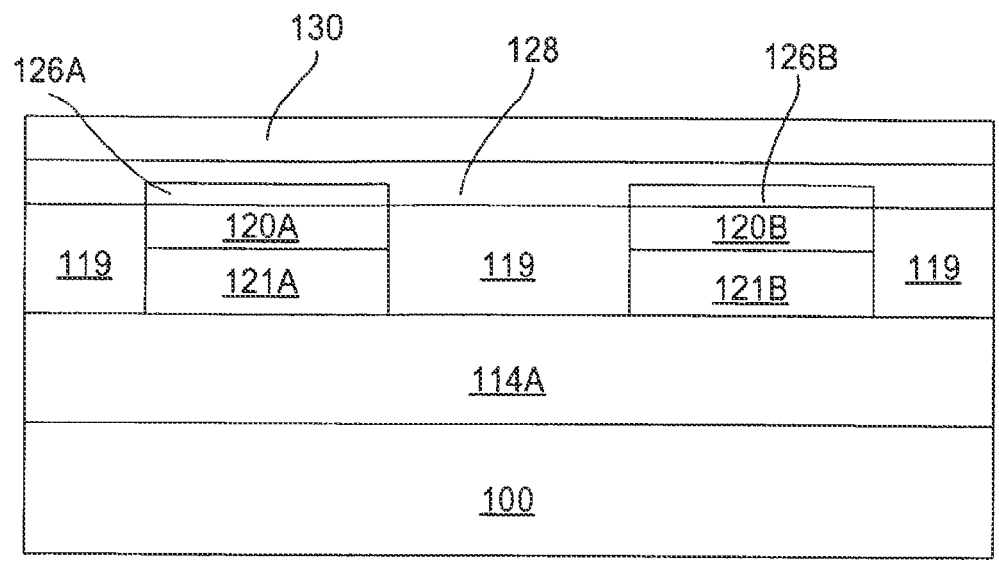
Figure 23:
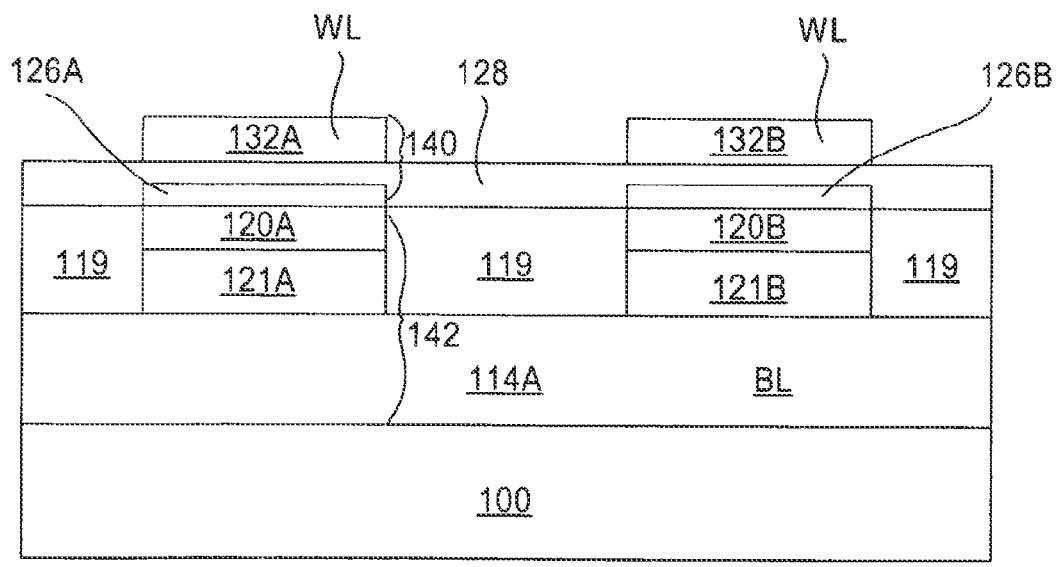

Next, a metal layer 124, for example cobalt, tantalum, nickel, titanium, platinum, palladium, tungsten, or hafnium is deposited over the resulting structure (FIG. 20) and (FIG. 21) a silicidation step is undertaken to form metal silicide regions 126A, 126B on the exposed silicon. The metal on the oxide does not react therewith and is removed after the silicidation step. Next, an insulating layer 128 is deposited over the resulting structure, and a metal layer 130 is deposited over the insulating layer 128 (FIG. 22). Using conventional masking and etching techniques, the metal layer 130 is formed into strips 132A, 132B running perpendicular to the plane of the drawing of FIG. 22 (see FIG. 23).

Figure 57:
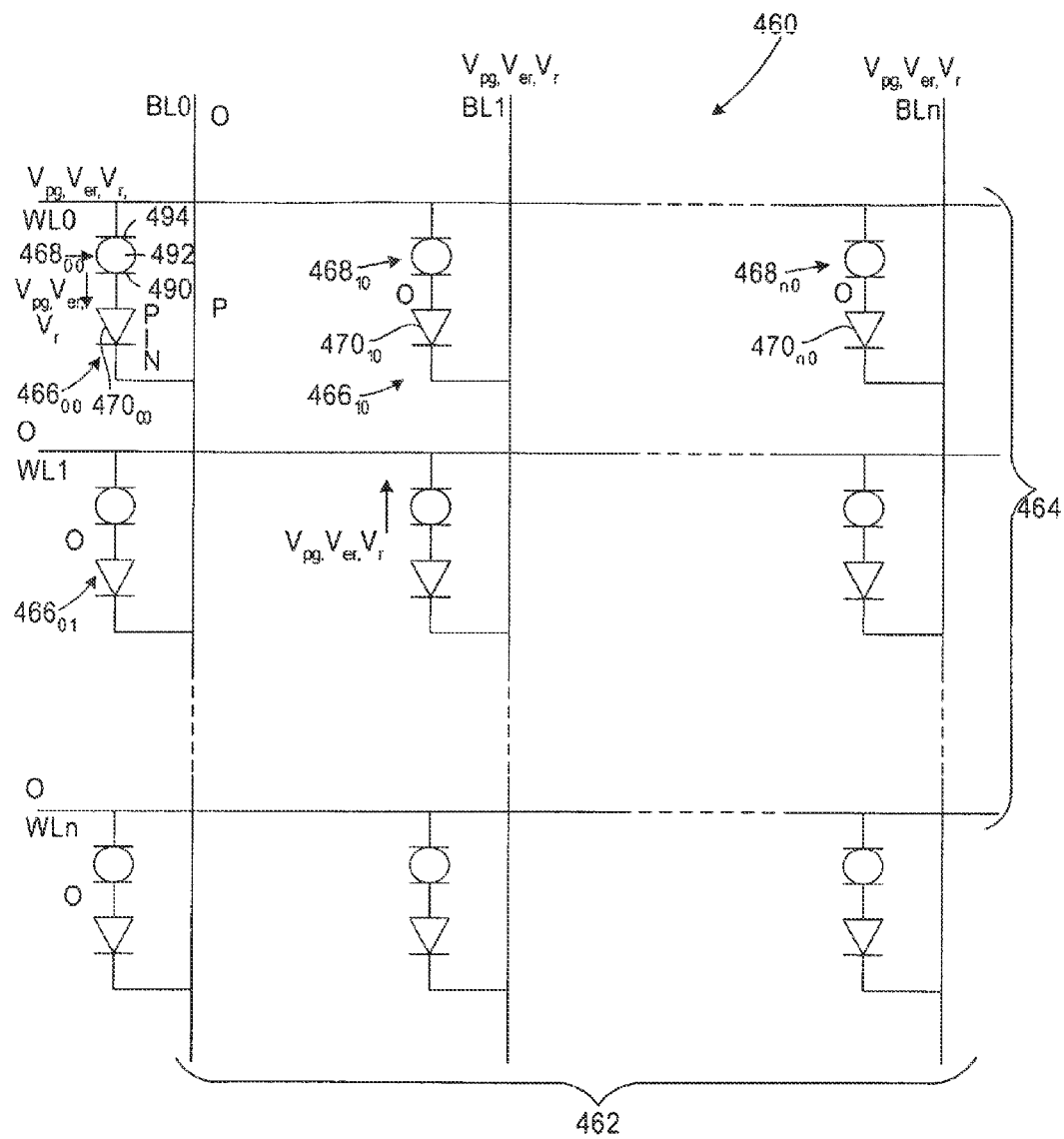
FIG. 57 illustrates programming, erasing and reading of a resistive memory cell of the present memory array incorporating the present P-I-N diodes.

In this embodiment, the elongated N+ regions 114A, 114B form bit lines of the array 460 of FIG. 57. As will be seen, a plurality of P-I-N diodes are formed, each connected in series with a resistive memory device. Each P-I-N diode includes an N+ region, an intrinsic (I) region, and a P+ region, in stacked relation. In contact with each P+ region is a silicide. On and in contact with this silicide is an insulating layer, and on and in contact with this insulating layer are metal strips. As an example, the silicide 126A, insulating layer 128, and metal strip 132A together form the respective first electrode, insulating layer, and second electrode of a metal-insulator-metal (MIM) resistive memory device 140 connected in series with the respective P-I-N diode 142 (including P+ region 120A, intrinsic region 121A, and N+ region 114A) associated therewith. The metal strips 132A, 132B form the word lines of the array 460 of FIG. 57.

Figure 24:
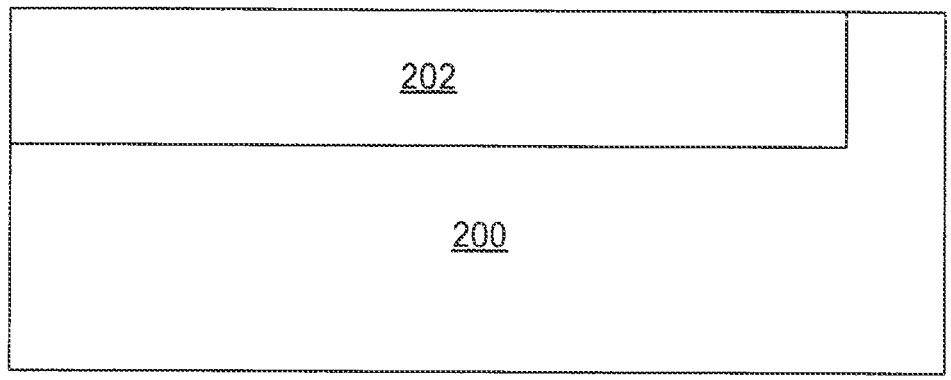
FIGS. 24-41 illustrate method steps in fabricating a second embodiment of diode and resistive memory device in accordance with the present invention.
Figure 25:
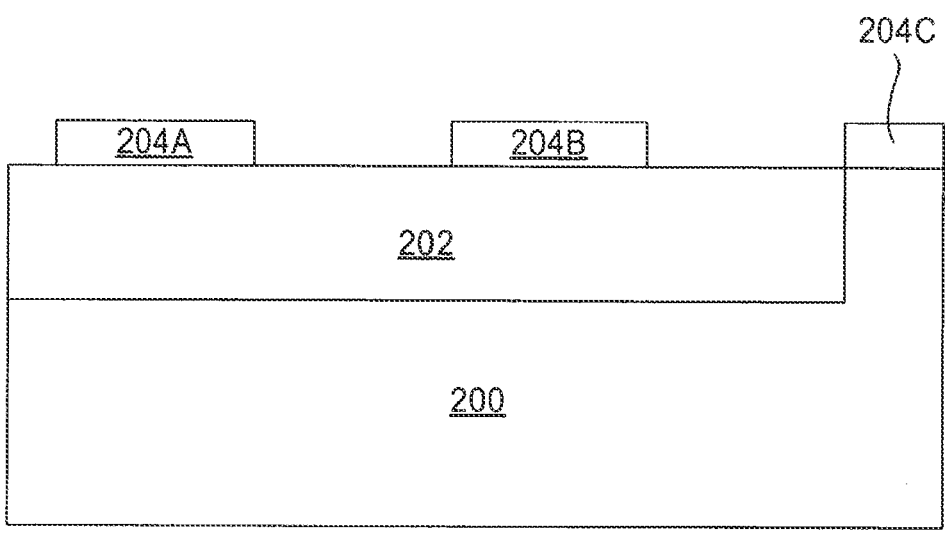
Figure 26:
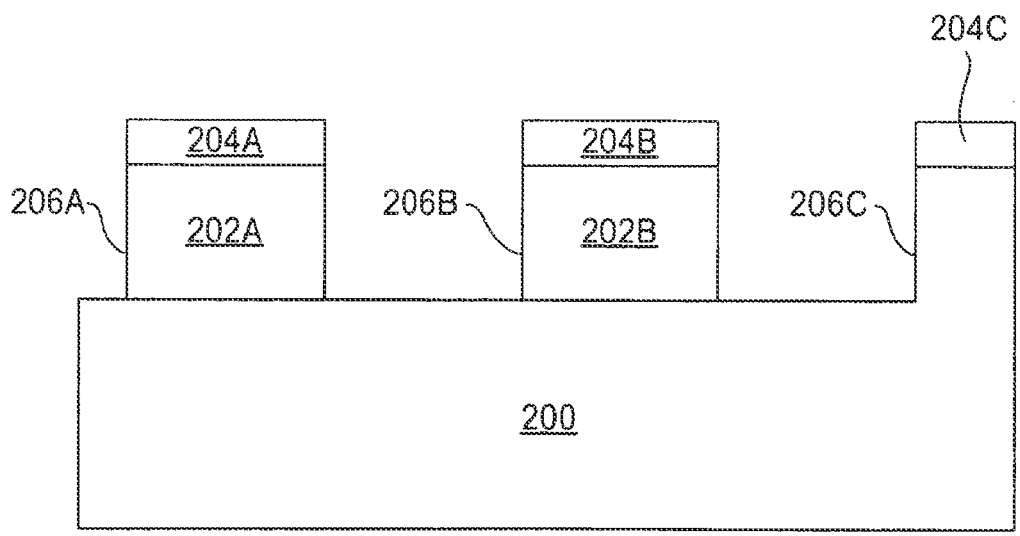
Figure 27:
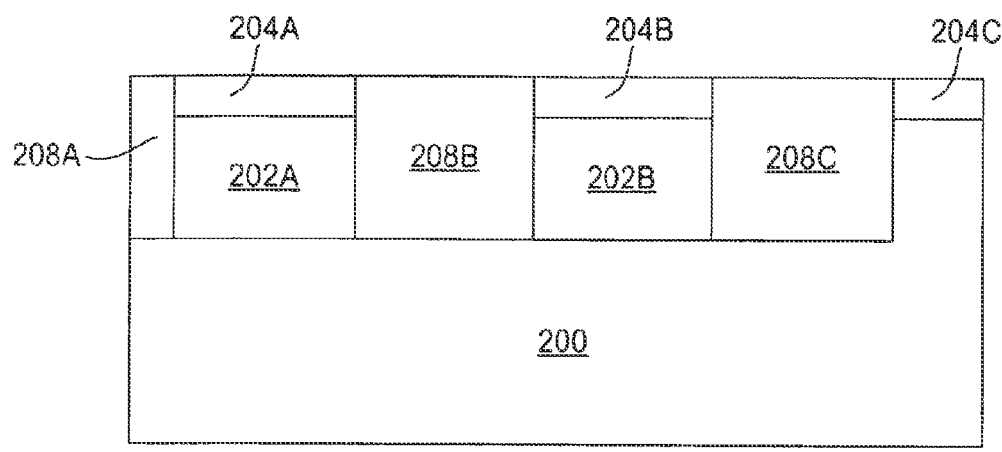
Figure 28:
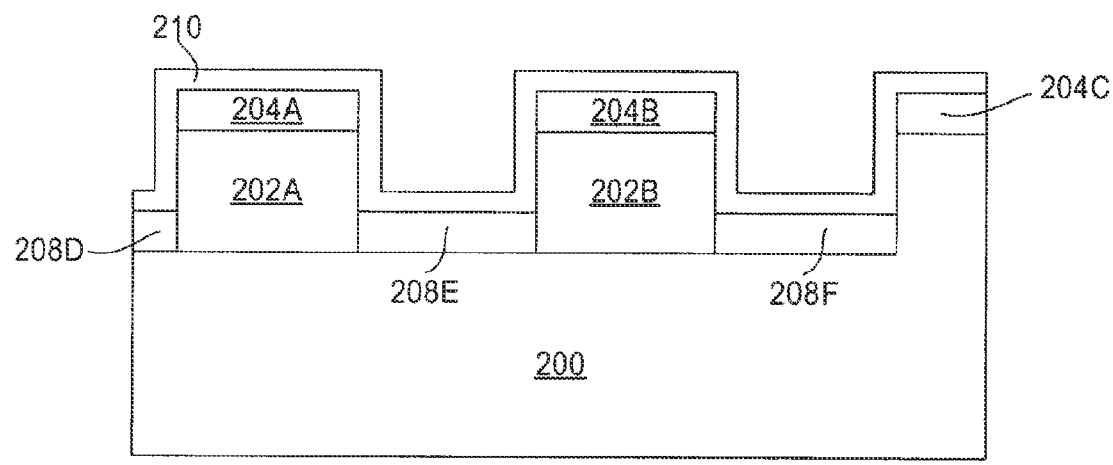
Figure 29:
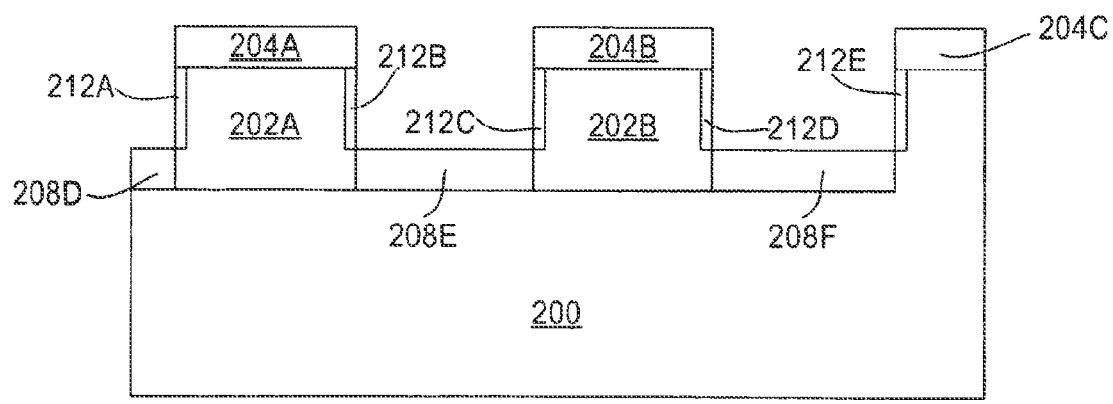

In a second embodiment of the invention, referring to FIG. 24, a monocrystalline P− silicon semiconductor substrate 200 is provided. Using appropriate masking techniques, an N+ ion blanket implant, for example phosphorous, is undertaken, at for example 5E15 keV, to form N+ region 202. A silicon nitride ($Si_3N_4$) layer is then deposited over the resulting structure and, using appropriate masking techniques, the silicon nitride layer is patterned into strips 204A, 204B, 204C running perpendicular to the plane of the drawing of FIG. 25. Using the silicon nitride strips 204A, 204B, 204C as a mask, the N+ region 202 is etched to form openings 206A, 206B, 206C therein (FIG. 26) and to define elongated N+ regions 202A, 202B in the form of strips running perpendicular to the plane of the drawing of FIG. 26. Next (FIG. 27), HDP undoped oxide 208A, 208B, 208C is deposited in the openings 206A, 206B, 206C, and a chemical mechanical polish (CMP) is undertaken to planarize the top surface of the resulting structure. Referring to FIG. 28, a substantial portion of the HDP oxide 208A, 208B, 208C is removed by etching, leaving a smaller portion of HDP oxide 208D, 208E, 208F. A metal layer 210, for example cobalt, tantalum, nickel, titanium, platinum, palladium, tungsten, or hafnium is deposited over the resulting structure (FIG. 28), and (FIG. 29) a silicidation step is undertaken to form metal silicide regions 212A, 212B, 212C, 212D, 212E on the sides of the exposed silicon. The metal on the oxide and nitride does not react therewith and the unreacted metal is removed after the silicidation step.

Figure 30:
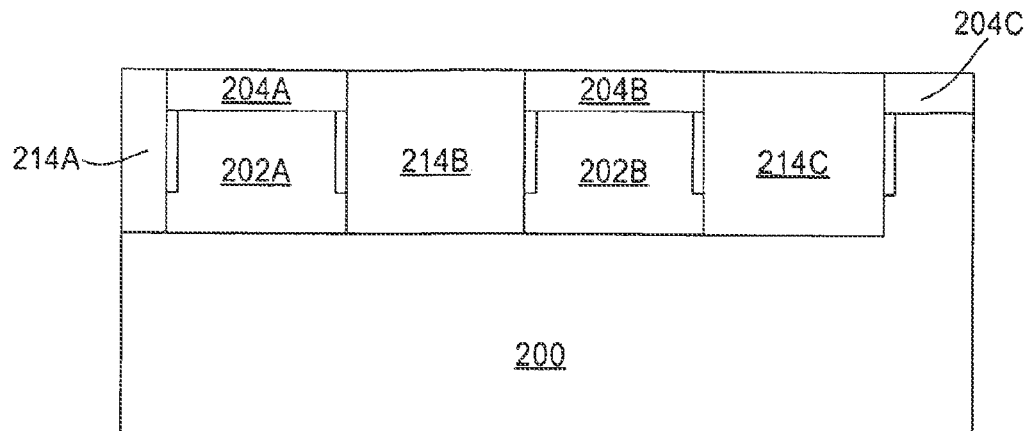
Figure 31:
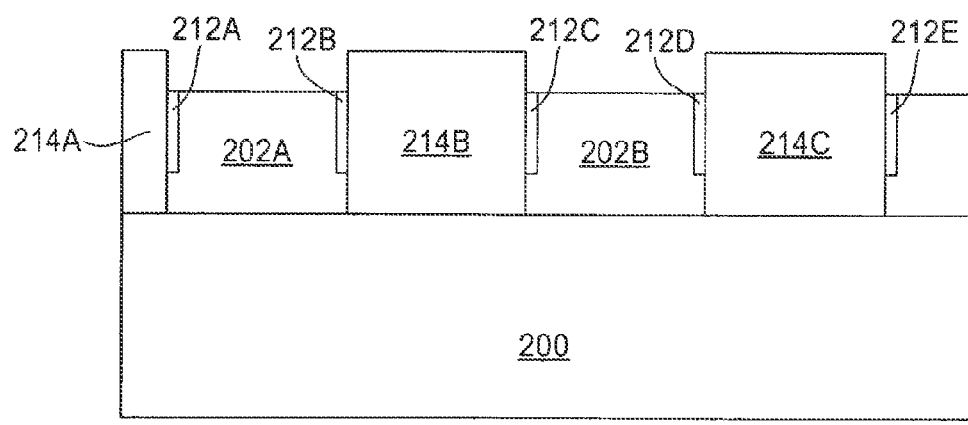

Next (FIG. 30), HDP undoped oxide 214A, 214B, 214C is deposited in the openings 206A, 206B, 206C, and a chemical mechanical polish (CMP) is undertaken to planarize the top surface of the resulting structure. The silicon nitride 204A, 204B, 204C is then removed (FIG. 31), and the openings over the exposed silicon (including N+ strips 202A, 202B) are filled with HDP oxide 216A, 216B, 216C (FIG. 32).

Figure 32:
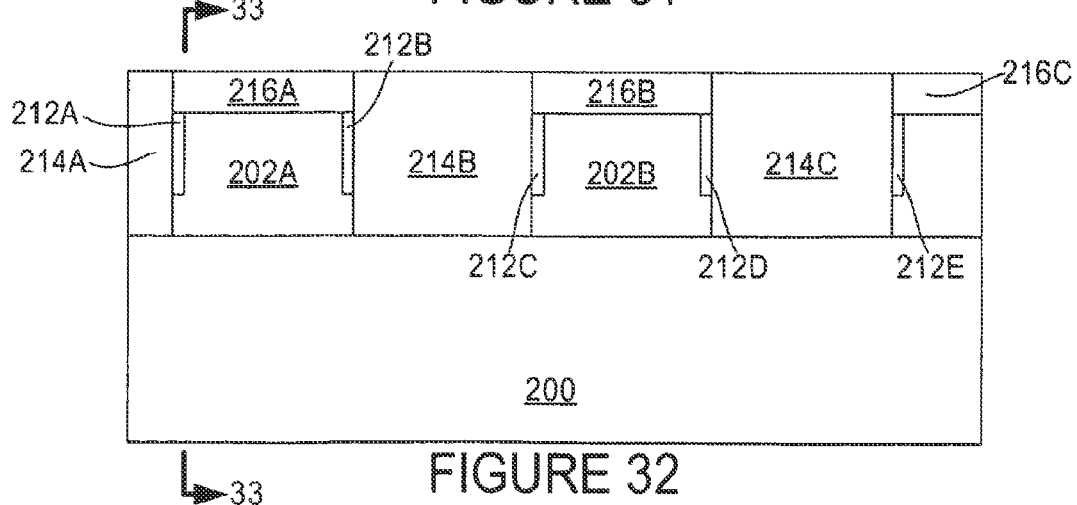
Figure 33:
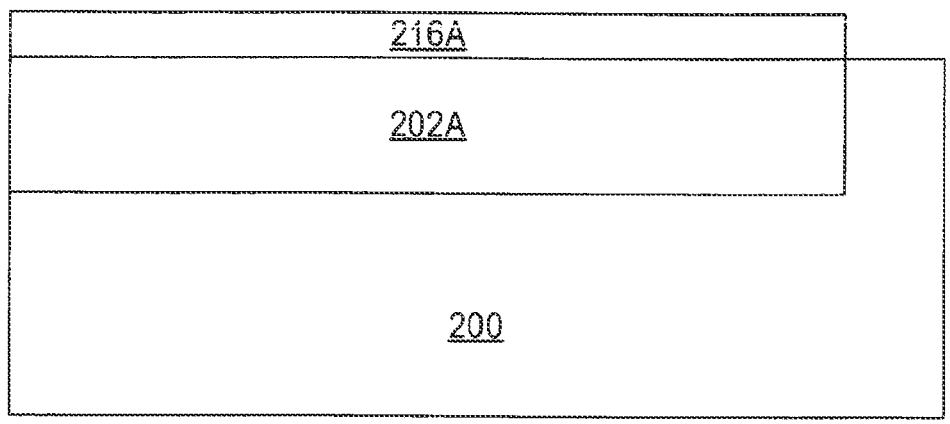
Figure 34:
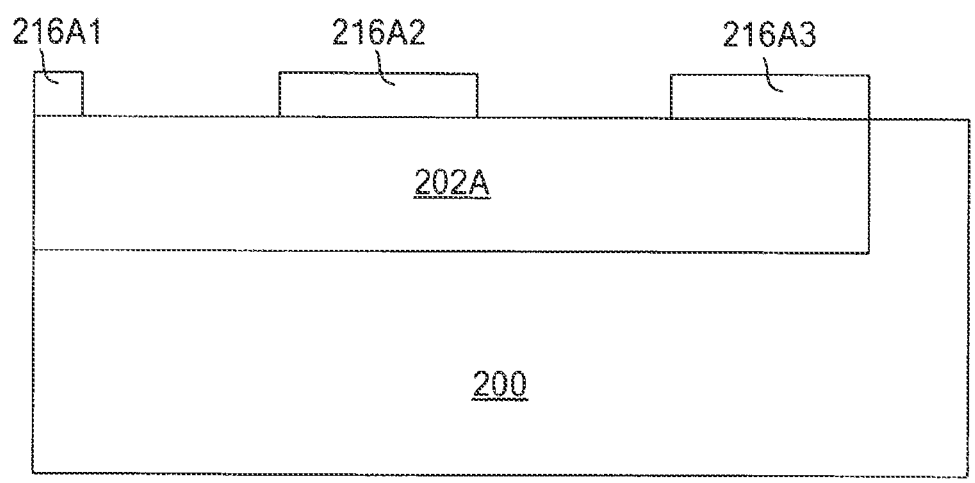
Figure 35:
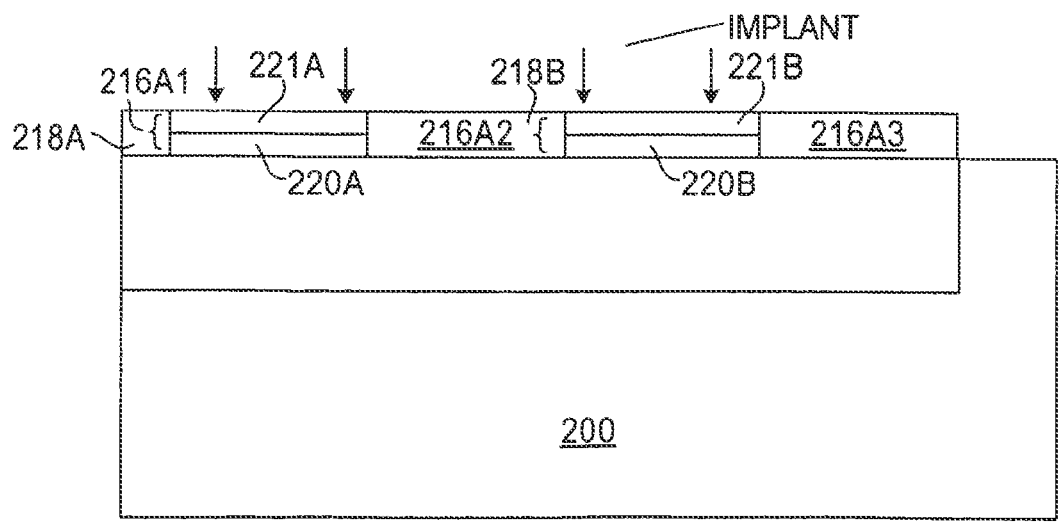

FIG. 33 as a view taken along the line 33-33 of FIG. 32. The oxide strip on each of the N+ regions is patterned as shown in FIG. 34 (oxide strip 216A patterned as 216A1, 216A2, 216A3 and N+ region 202A shown in FIG. 34), using appropriate masking technology. This patterning of the oxide 216A provides rectangular openings therethrough on and over the associated N+ strip 202A, the openings being configured as shown in FIG. 35 along the length of the associated N+ strip 202A and substantially equal in width to the associated N+ strip 202A. Monocrystalline epitaxial silicon layers 218A, 218B are then grown on the exposed silicon, rectangular in configuration, and filling the openings in the oxide layer 216A (FIG. 35). Similar to the previous embodiment, an ion implant and activation is undertaken, implanting for example boron into the exposed portions of the epitaxial silicon 218A, 218B, to simultaneously form P+ region 221A, 221B respectively therein, to a depth so that in each epitaxial layer, there is defined an intrinsic region 220A, 220B respectively between the P+ region thereof and the N+ region (FIG. 35).

Figure 36:
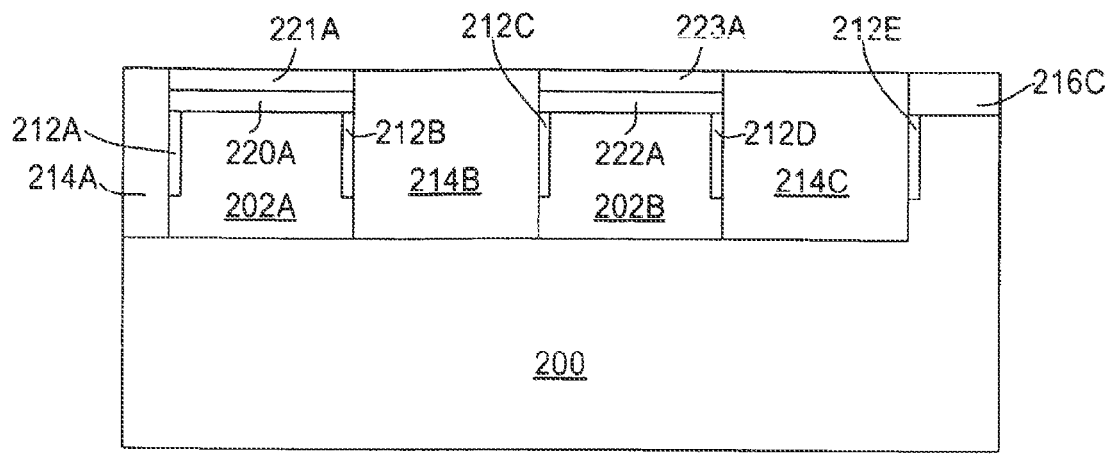
Figure 37:
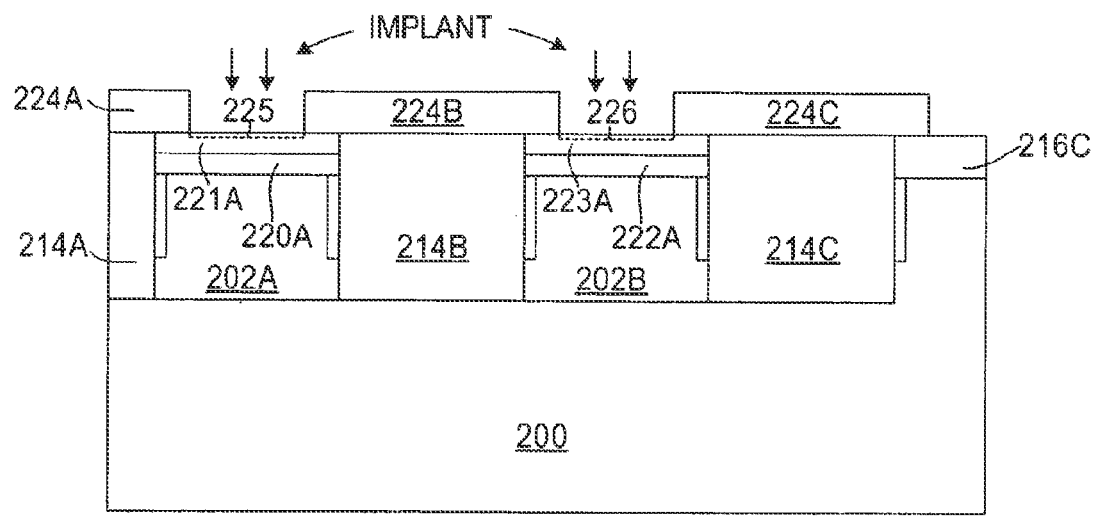
Figure 38:
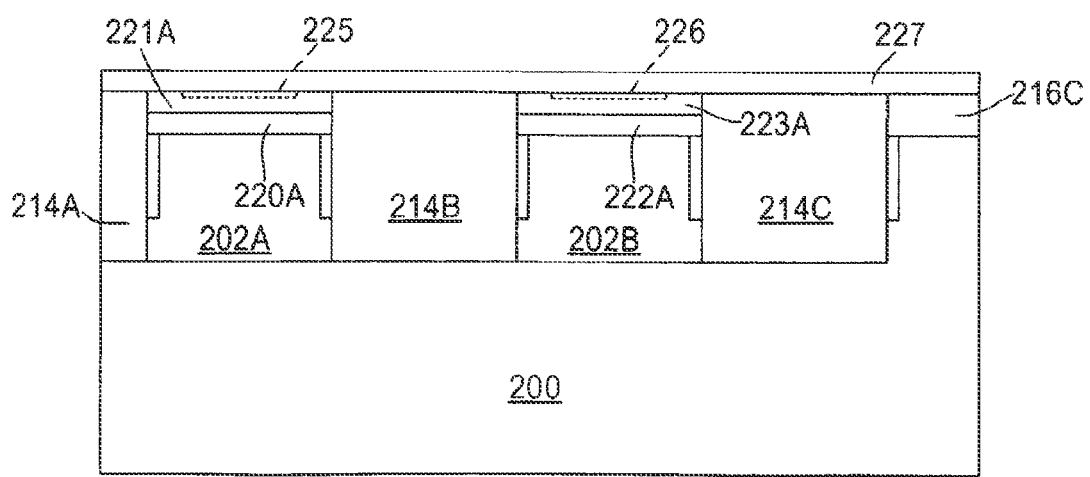
Figure 39:
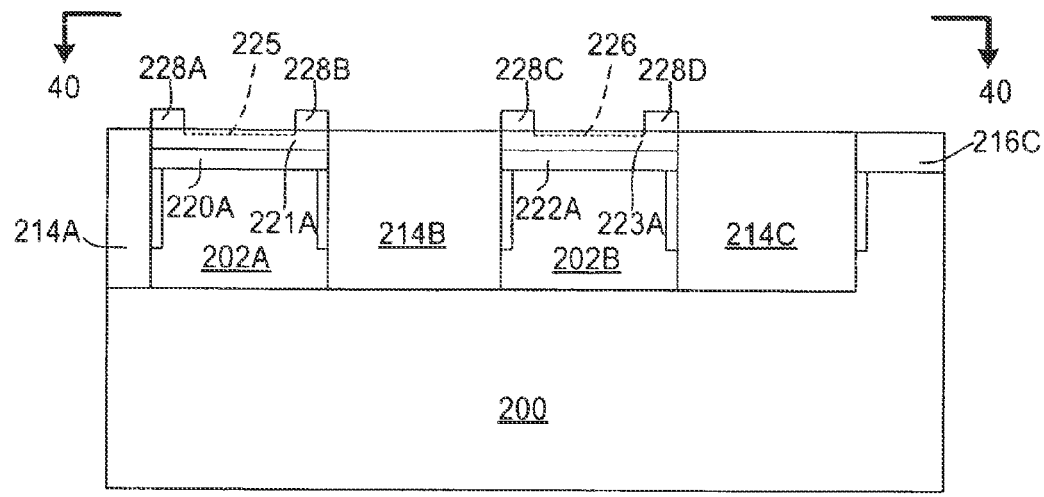
Figure 40:
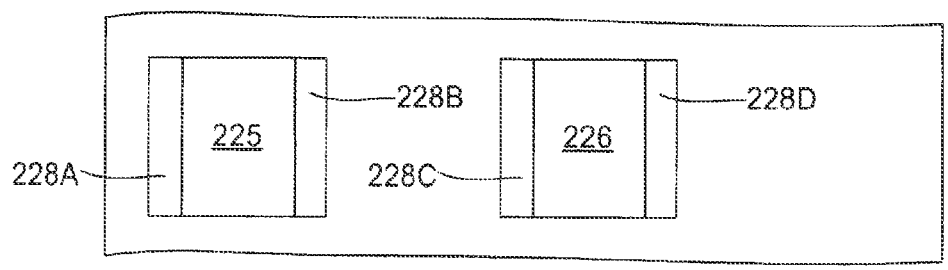

FIG. 36 is a view of the structure of FIG. 35, taken from the position in viewing FIGS. 24-32. Referring to FIG. 37, using appropriately patterned photoresist 224A, 224B, 224C as masking to block off opposite edges of each P+ region and to leave exposed a central portion thereof, an implant of $O_2$ is undertaken into the exposed P+ regions 221A, 223A to form $O_2$-implanted regions 225, 226. After removal of the photoresist 224A, 224B, 224C, a metal layer 227, for example, cobalt, tantalum, nickel, titanium, platinum, palladium, tungsten, or hafnium is deposited over the resulting structure (FIG. 38) and (FIG. 39, and FIG. 40, a view taken along the line 40-40 of FIG. 39) a silicidation step is undertaken to form metal silicide regions 228A, 228B, 228C, 228D on the exposed silicon. The metal on the oxide and on the $O_2$-implanted silicon 225, 226 does not react therewith and the unreacted metal is removed after the silicidation step.

Figure 41:
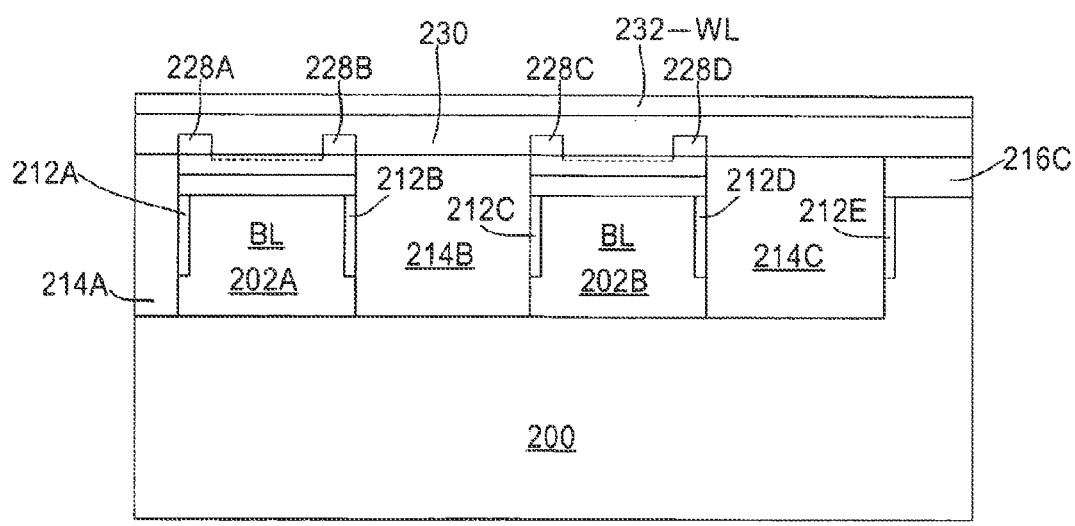

Next, an insulating layer 230 is deposited over the resulting structure, and a metal layer 232 is deposited over the insulating layer 230 (FIG. 41). Using conventional etching techniques, the metal layer 232 is formed into strips running parallel to the plane of the drawing of FIG. 41.

In this embodiment, the elongated N+ regions 202A, 202B form bit lines of the array 460 of FIG. 57. As will be seen, a plurality of P-I-N diodes are formed, each connected in series with a resistive memory device. Each P-I-N diode includes an N+ region, an intrinsic (I) region, and a P+ region. In contact with each P+ region is a silicide. On and in contact with this silicide is an insulating layer, and on and in contact with this insulating layer are metal strips. As an example, the silicide 228A, insulating layer 230, and metal strip 232 together form the respective first electrode, insulating layer, and second electrode of a metal-insulator-metal (MIM) resistive memory device connected in series with the respective P-I-N diode (221A, 220A, 202A) associated therewith. The metal strips 232 form the word lines in the array 460 of FIG. 57.

The silicide regions 212A, 212B, 212C, 212D, 212E on each N+ strip act as low resistance conductors connecting that N+ region with its associated intrinsic region.

Figure 42:
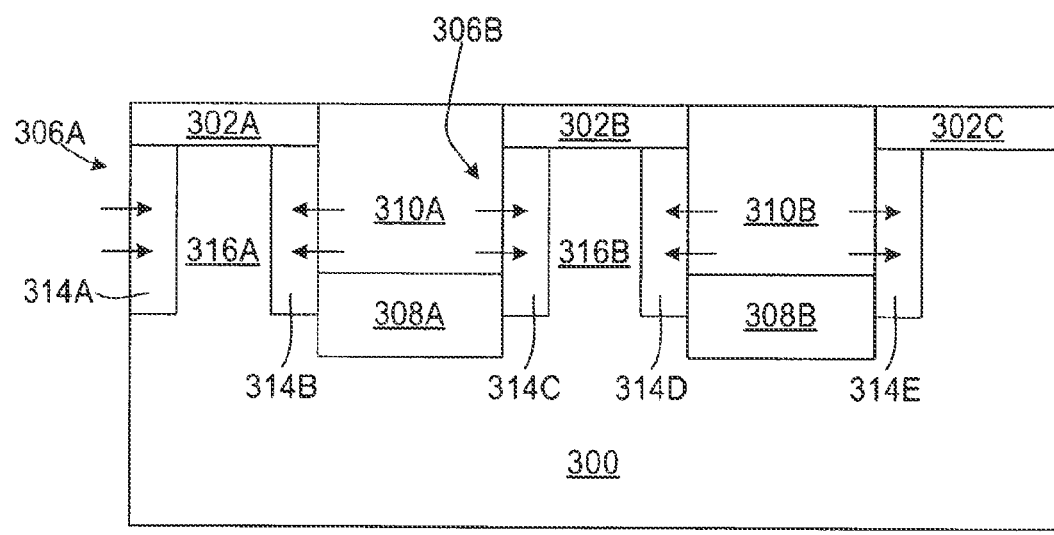
FIGS. 42-54 illustrate method steps in fabricating a third embodiment of diode and resistive memory device in accordance with the present invention.

In a third embodiment of the invention, referring to FIG. 42, the structure formed is similar to that of FIG. 9, including monocrystalline substrate 300, oxide regions 308A, 308B, N+ (for example phosphorus) doped oxide regions 310A, 310B, silicon strips 306A, 306B, and silicon nitride strips 302A, 302B, 302C. At this point in the process, high temperature is applied to the resulting structure, causing phosphorus dopant to simultaneously diffuse from each of the phosphorus doped oxide portions into the adjacent silicon strips on opposite sides thereof. In this way, N+ regions 314A, 314B, 314C, 314D, 314E are formed, the diffusion being controlled and limited so that an intrinsic portion remains between the N+ regions formed in each silicon strip (316A, 316B shown). An N+ activation step is then undertaken.

Figure 43:
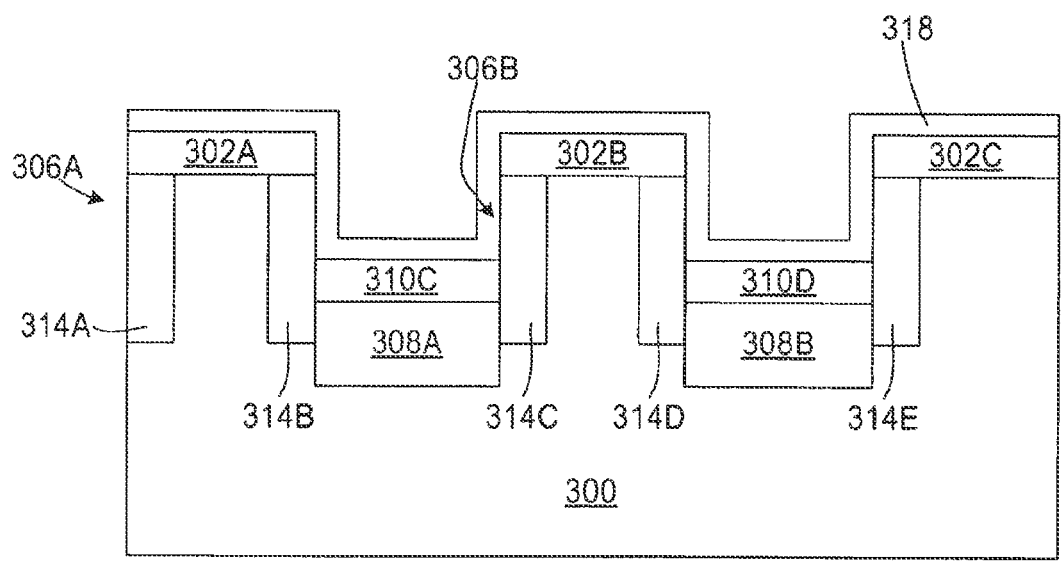
Figure 44:
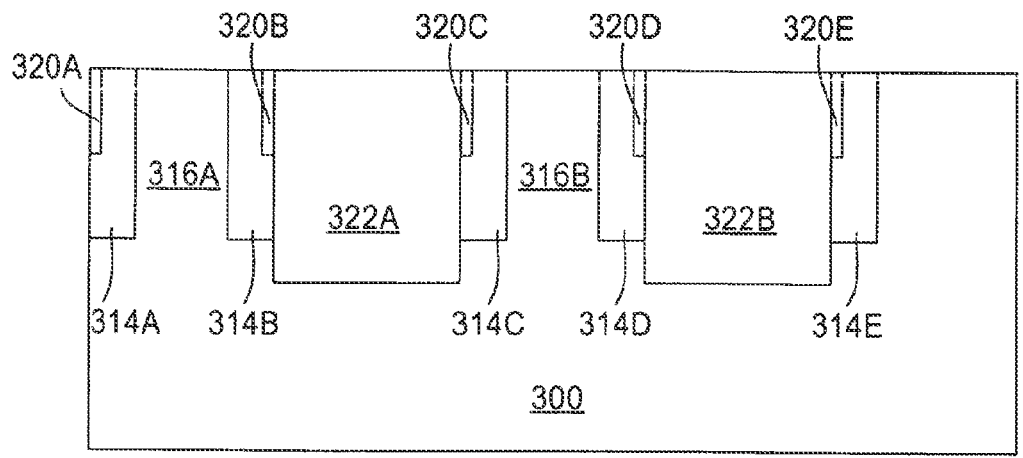

Next, portions of the phosphorus doped oxide 310A, 310B are removed, leaving smaller portions 310C, 310D on the HDP oxide 308A, 308B, and a metal layer 318, for example cobalt, tantalum, nickel, titanium, platinum, palladium, tungsten, or hafnium is deposited over the resulting structure (FIG. 43). A silicidation step is undertaken to form metal silicide regions 320A, 320B, 320C, 320D, 320E on the exposed silicon. The metal on the oxide and nitride does not react therewith and the unreacted metal is removed after the silicidation step. The N+ oxide and oxide regions 308A, 308B are then removed, and the remaining openings are filled with (undoped) HDP oxide 322A, 322B (FIG. 44).

Figure 45:
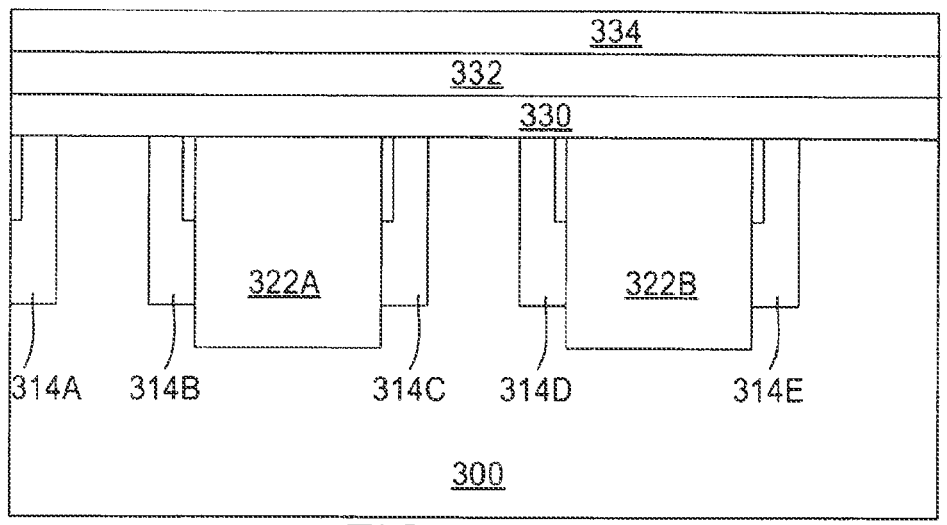
Figure 46:
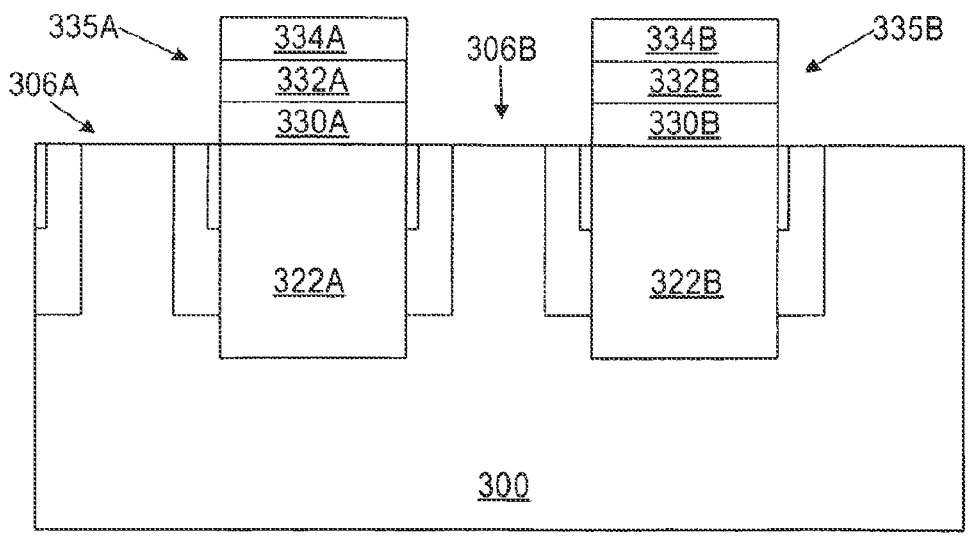
Figure 47:
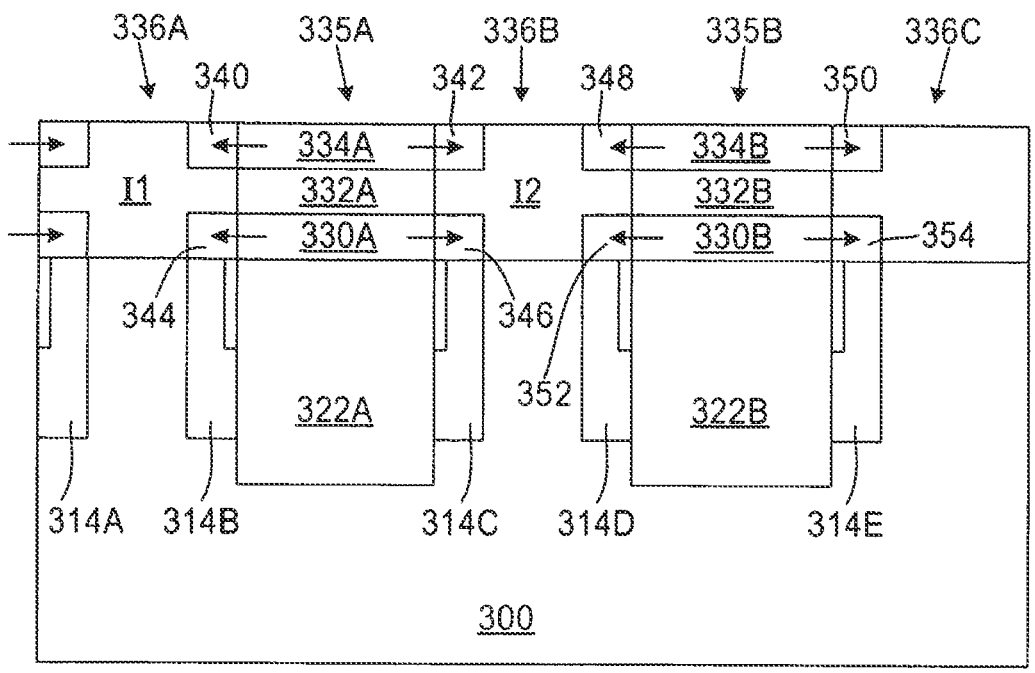

Then (FIG. 45), successive layers of N+ (for example phosphorous) doped oxide 330, undoped oxide 332, and P+ (for example boron) doped oxide 334 are applied and etched to form strips 335A, 335B running on and along the oxide 322A, 322B therebeneath (FIG. 46), the strips 335A, 335B running perpendicular to the plane of the drawing of FIG. 46. Referring to FIG. 47, monocrystalline silicon epitaxial layers 336A, 336B, 336C in the form of strips are then grown on the exposed silicon. Next, high temperature is applied to the resulting structure, causing dopant to simultaneously flow and diffuse from portions between the epitaxial strips into both of those epitaxial strips, to simultaneously form a pair of P+ regions in each of the silicon strips and a pair of N+ regions in each of the epitaxial strips. The P+ regions in each strip are separated by an intrinsic region, and the N+ regions in each strip are separated by an intrinsic region. The P+ and N+ regions adjacent the N+ doped oxide, undoped oxide, and P+ doped oxide are separated by an intrinsic region. For example, dopant flows from doped oxide region 334A into the adjacent epitaxial layer 336A and the adjacent epitaxial layer 336B to form P+ regions 340 and 342 respectively therein. At the same time, dopant flows from doped oxide region 330A into the adjacent epitaxial layer 336A and the adjacent epitaxial layer 336B to form N+ regions 344 and 346 respectively therein. Likewise, dopant flows from doped oxide region 334B into the adjacent epitaxial layer 336B and the adjacent epitaxial layer 336C to form P+ regions 348 and 350 respectively therein. At the same time, dopant flows from doped oxide region 330B into the adjacent epitaxial layer 336B and the adjacent epitaxial layer 336C to form N+ regions 352 and 354 respectively therein. Intrinsic regions 11, 12 remain as shown. All of these P+ and N+ regions are formed simultaneously. Then, an activation step is then undertaken.

Figure 48:
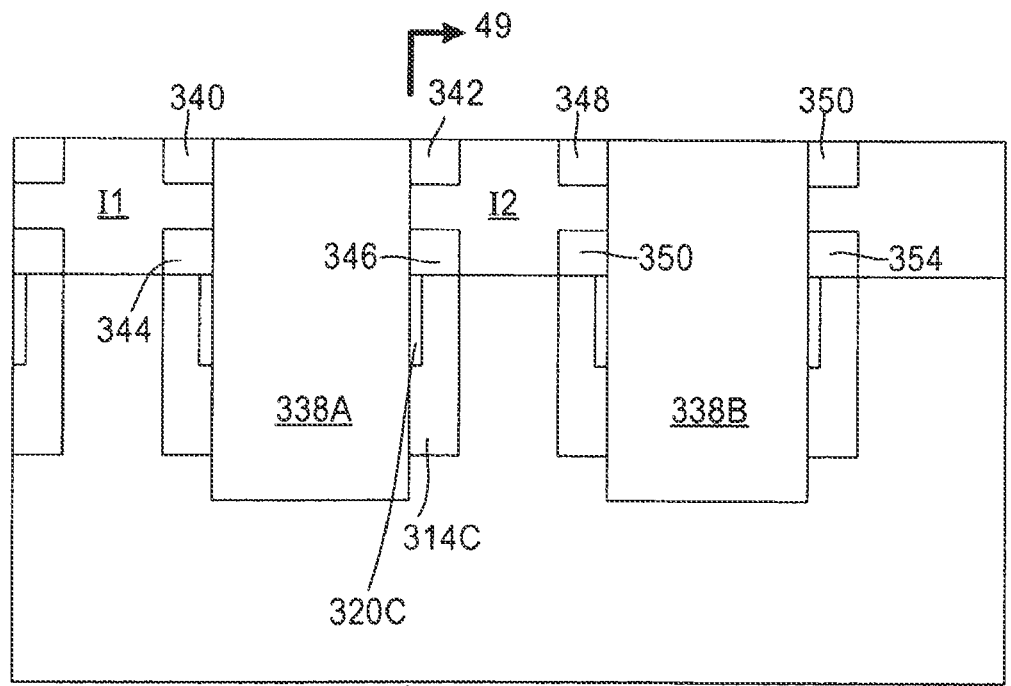
Figure 49:
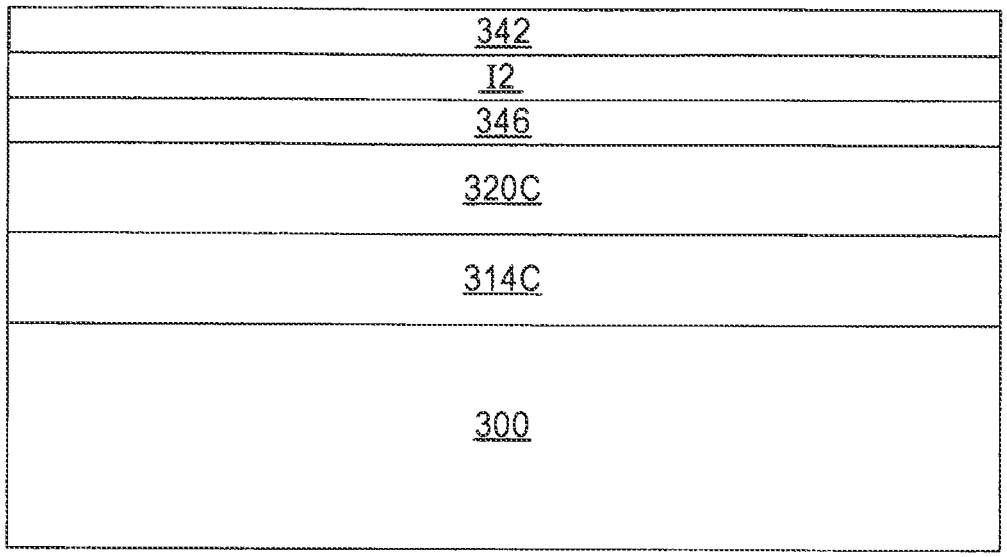

Next (FIG. 48), the strips 335A, 335B and oxide 322A, 322B are removed and the resulting openings are filled with undoped HDP oxide 338A, 338B. FIG. 49 shows the resulting structure of FIG. 48 taken along the line 49-49 of FIG. 48.

Figure 50:
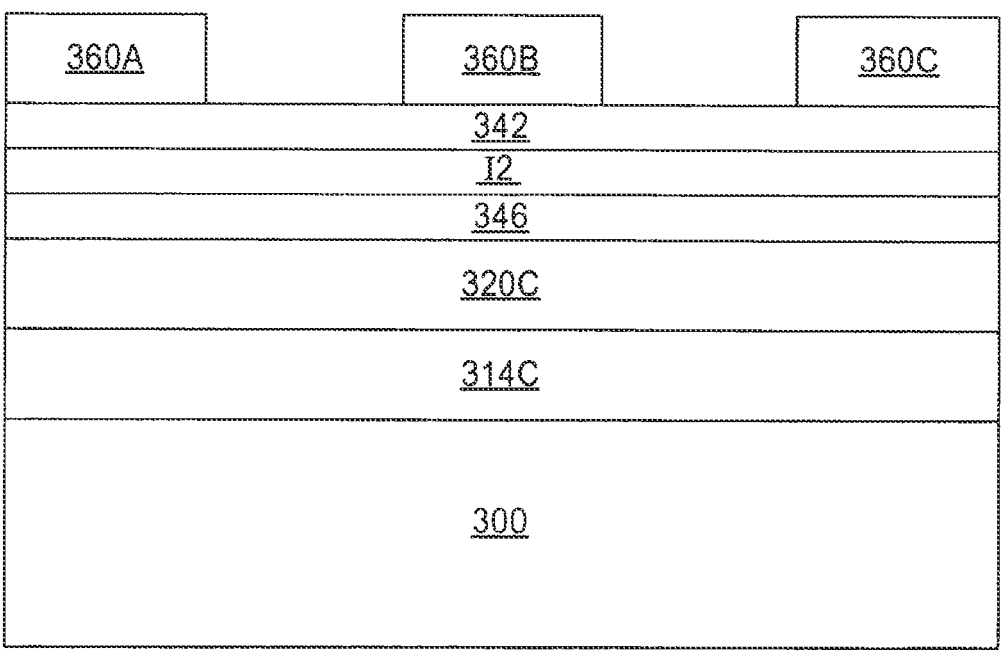
Figure 51:
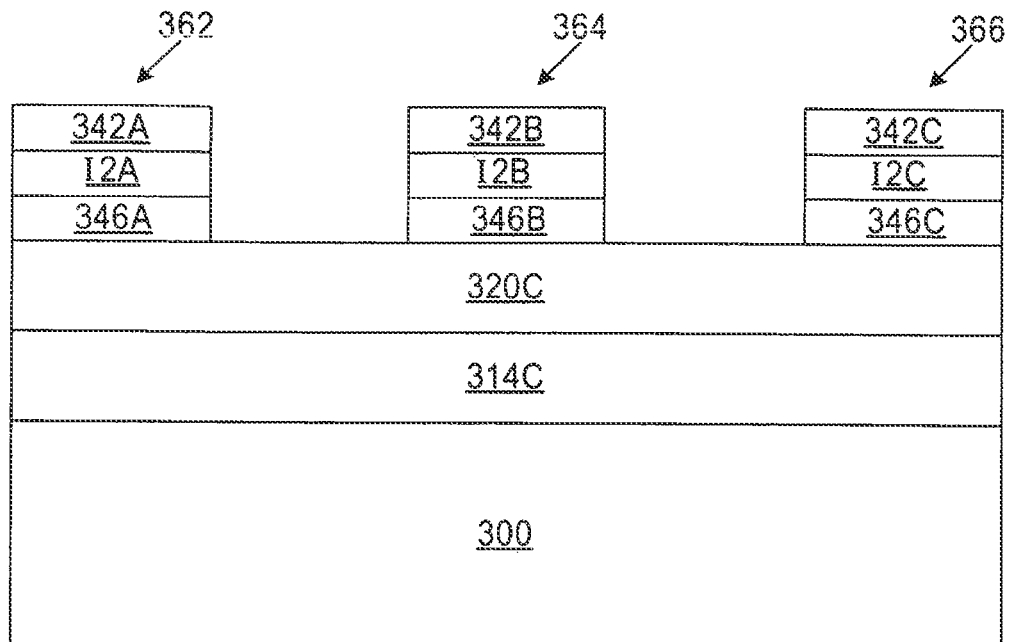
Figure 52:
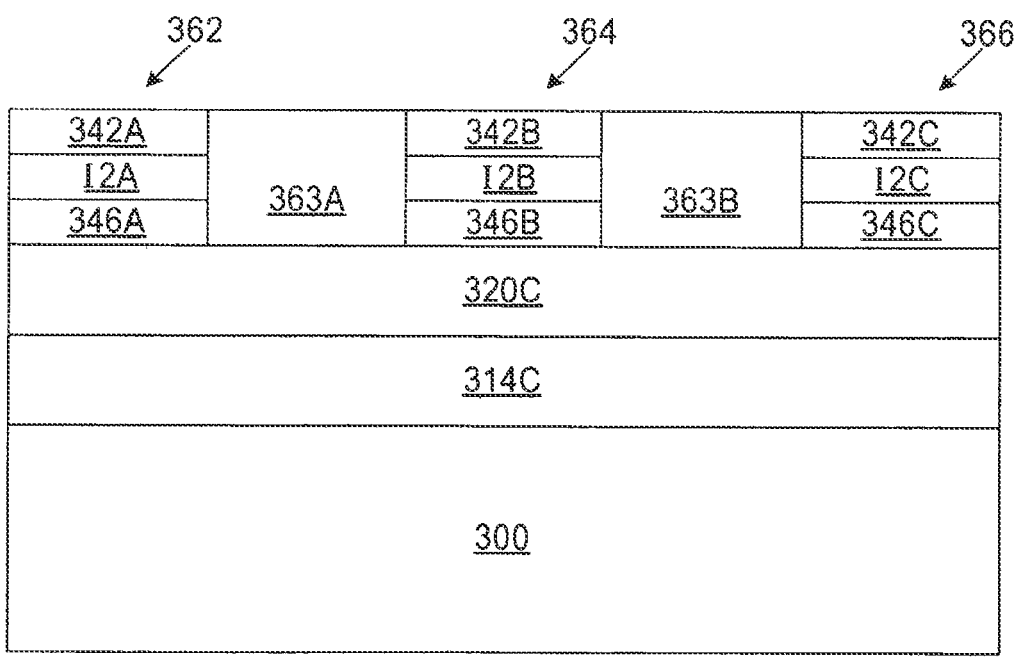
Figure 53:
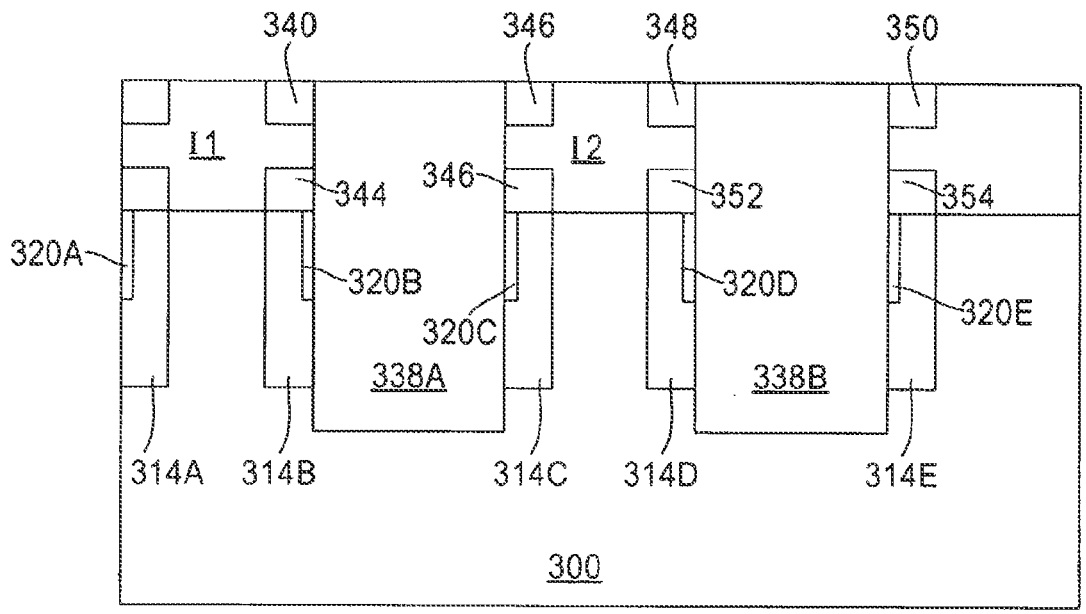
Figure 54:
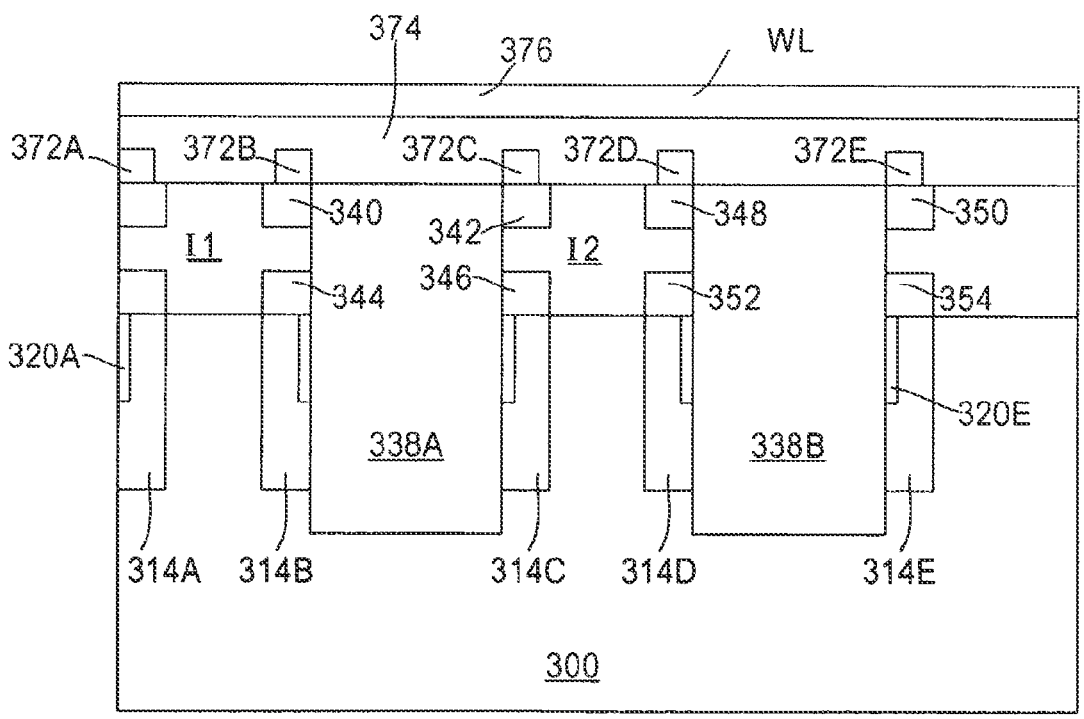

As shown in FIG. 50, photoresist is applied to the resulting structure and is patterned as shown in that FIG. 360A, 360B, 360C). An etching step is undertaken, using the photoresist as a mask, to for form pillars 362, 364, 366, respectively including N+ regions 346A, 346B, 346C, intrinsic regions 12A, 12B, 12C, and P+ regions 342A, 342B, 342C (FIG. 51). The photoresist is removed, and the resulting openings are filled with undoped HDP oxide 363A, 363B (FIG. 52). FIG. 53 is a view of the structure of FIG. 52 as viewed in a manner similar to the previous FIGS. 42-48. Similar to the previous embodiments, a metal layer 370 is deposited and patterned, and a silicidation step is undertaken to form silicide regions 372A, 372B, 372C, 372D, 372E in contact with the respective P+ regions. An insulating layer 374 is deposited thereover, and a metal layer 376 is deposited on the insulating layer 374 and is patterned to provide strips running parallel to the plane of the drawing of FIG. 54.

In this embodiment, the elongated N+ regions 314A, 314B, 314C, 314D, 314E form the bit lines of the array 460 of FIG. 57. As will be seen, a plurality of P-I-N diodes are formed. Each includes an N+ region, an intrinsic (I) region, and a P+ region. In contact with each P+ region is a silicide. On and in contact with this silicide region is an insulating layer, and on and in contact with this insulating are the metal strips. As an example, the silicide 372B, insulating layer 374, and metal strip 376 together form the respective first electrode, insulating layer, and second electrode of a metal-insulator-metal (MIM) resistive memory device connected in series with the respective P-I-N diode (340, 11, 344) associated therewith. The metal strips 376 form the word lines in the array 460 of FIG. 57.

The silicide regions 320A, 320B, 320C, 320D, 320E on each N+ region act as low resistance conductors connecting that N+ region with its associated P-I-N diode.

Figure 55:
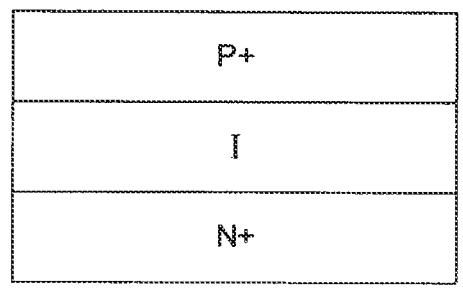
FIGS. 55 and 56 illustrate the present P-I-N diode and its operating characteristics.
Figure 56:
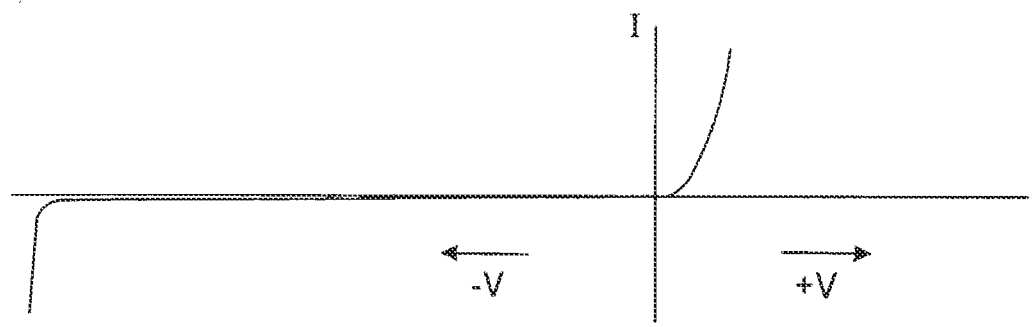

FIGS. 55 and 56 illustrate the structure and operating characteristics of a P-I-N diode formed in accordance with the above methods. As shown in FIG. 55, the P-I-N diode includes N+ region and P+ region separated by an intrinsic region 1. As illustrated in FIG. 56, with the diode forward biased (higher potential applied to P+ region than to N+ region, +V), current flows in the forward direction through the diode, with the diode exhibiting decreasing resistance with increasing current, as is typical with the P-I-N diode configuration. Meanwhile, such a diode exhibits a high reverse breakdown voltage (higher potential applied to N+ region than to P+ region, −V).

Figure 58:
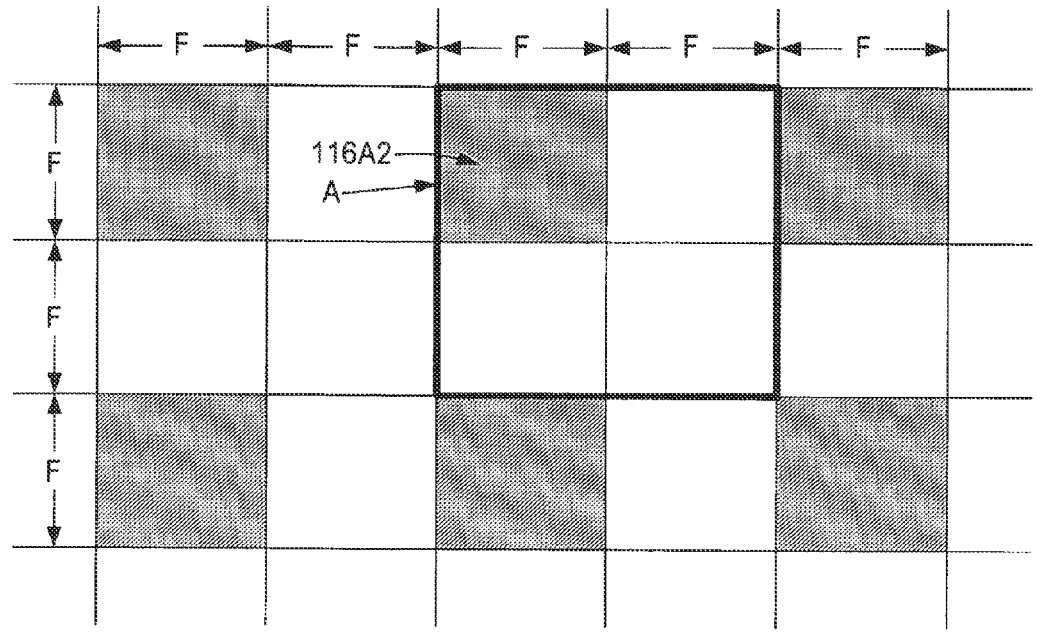
FIGS. 58 and 59 illustrate devices in relation to feature size.
Figure 59:
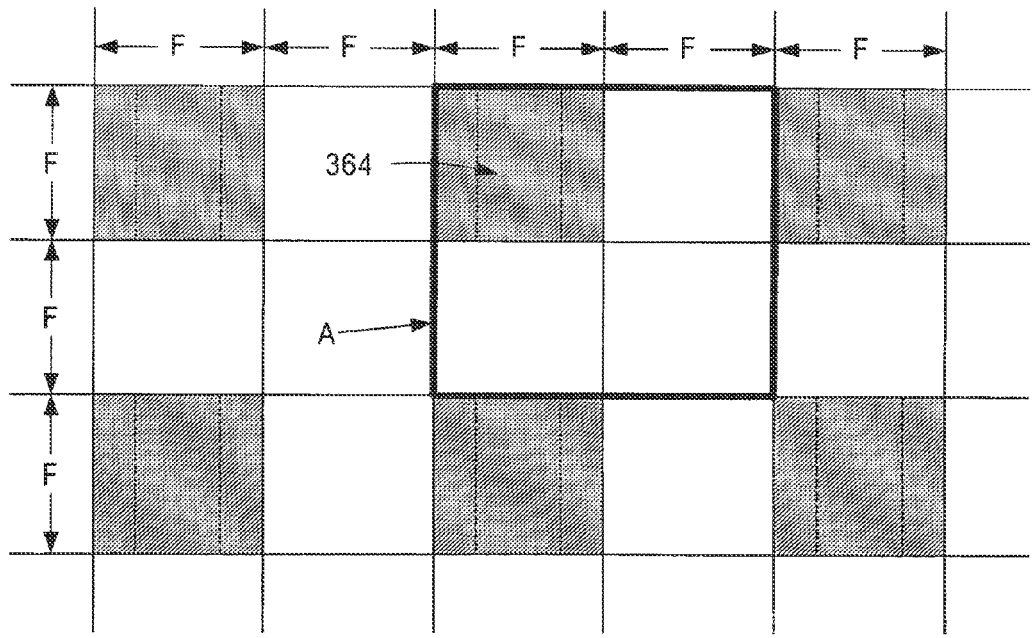

FIG. 57 illustrates a resistive memory array 460 incorporating the present invention. The array 460 includes a first plurality of parallel conductors 462 (bit lines) BL0, BL1, . . . BLn, and a second plurality of parallel conductors 464 (word lines) WL0, WL1, . . . WLn overlying and spaced from, orthogonal to, and crossing the first plurality of conductors 462. A plurality of memory structures 466 are included in the array 460. Each memory structure 466 includes a resistive memory cell 468 (including as shown for resistive memory cell $468_{00}$ a first electrode 490, insulating layer 492 on and in contact with first electrode 490, and second electrode 494 on and in contact with the insulating layer 492), and a diode 470 in series therewith connecting a conductor WL of the plurality thereof with a conductor BL of the plurality thereof at the intersection of those conductors, with the diode thereof oriented in a forward direction from the conductor WL to the conductor BL. These memory structures 466 take the various forms shown and described above, including any of the various forms of P-I-N diode. The P-I-N diode characteristics insure that the diodes allow for proper programming, erasing and reading of a selected memory device (application of $V_{pg}$, $V_{er}$ and $V_r$ as previously shown and described), meanwhile acting as select devices for other memory devices in the array 460 so as to avoid disturbing the state thereof. The diodes exhibit very low current leakage and high drivability. In addition, it will be noted that in each embodiment only two masking steps are required to fabricate the P-I-N diodes, resulting in high efficiency in the manufacturing process, in the interest of forming an overall structure of very high density, the pillars in all embodiments are with advantage formed using minimum feature size F. This minimum feature size F also determines the space between adjacent pillars in the horizontal and vertical directions (FIGS. 58 and 59). The unit block A of FIGS. 58 and 59, dimensions 2F×2F (dark lined box), including a pillar (dark hatching) and three adjacent spaces, repeats itself across the overall structure. Each block (including the indicated unit block A) has an area $2F\times2F=4F^2$. Thus, where each pillar includes a single P-I-N diode and a single memory device associated therewith (i.e., the embodiments of FIGS. 6-23 and also FIG. 58, pillar 116A2 illustrated in unit block A), one P-I-N diode and one memory device are provided for each area $4F^2$.

Device density is improved where each pillar includes two P-I-N diodes, with two memory device associated therewith (i.e., the embodiments of FIGS. 24-54 and also FIG. 59, illustrating pillar 364 in unit block A). As such, two P-I-N diodes and two memory device are provided for each area $4F^2$, i.e., one P-I-N diode and one associated memory device for each area $2F^2$ ($4F^2/2$). This approach, it will be seen, provides improved scaling through increased devices density.

FIG. 60 illustrates a system 500 utilizing devices as described above. As shown therein, the system 500 includes hand-held devices in the form of cell phones 502, which communicate through an intermediate apparatus such as a tower 504 (shown) and/or a satellite. Signals are provided from one cell phone to the other through the tower 504. Such a cell phone 502 with advantage uses devices of the type described above. One skilled in the art will readily understand the advantage of using such devices in other hand-held devices.

FIG. 61 illustrates another system 600 utilizing devices as described above. The system 600 includes a vehicle 602 having an engine 604 controlled by an electronic control unit 606. The electronic control unit 606 with advantage uses devices of the type described above.

Figure 62:
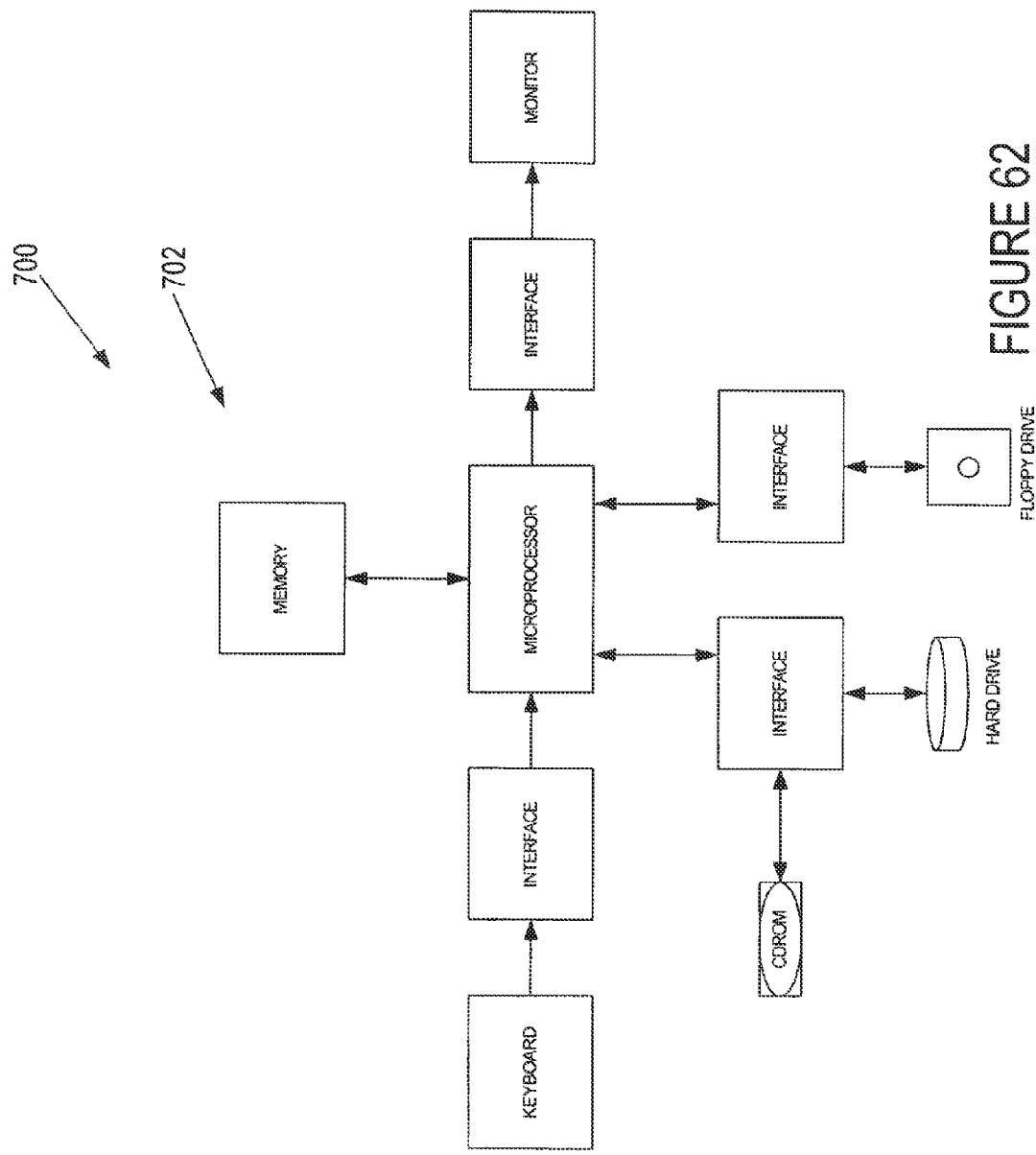

FIG. 62 illustrates yet another system 700 utilizing devices as described above. This system 700 is a computer 702 which includes an input in the form of a keyboard, and a microprocessor for receiving signals from the keyboard through an interface. The microprocessor also communicates with a CDROM drive, a hard drive, and a floppy drive through interfaces. Output from the microprocessor is provided to a monitor through an interface. Also connected to and communicating with the microprocessor is memory which may take the form of ROM, RAM, flash and/or other forms of memory. The memory and other parts of the computer 702 with advantage use devices of the type described above.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. An electronic structure comprising:
 a resistive memory device; and
 a P-I-N diode in operative association with the resistive memory device, wherein the electronic structure is a pillar, wherein the P-I-N diode comprises a body comprising a first region of a first selected conductivity type, a second region of a second selected conductivity type opposite the first conductivity type, and an intrinsic region between the first and second regions, wherein the first and second regions and the intrinsic region are stacked in a column, wherein the first region is linearly elongated such that the first region forms a first selected conductivity type region of a second P-I-N diode of a linear plurality of P-I-N diodes and each of the first region, the second region and the intrinsic region of each P-I-N diode of the linear plurality of P-I-N diodes are of similar dimensions to each of the first region, the second region, and the intrinsic region of another P-I-N diode of the linear plurality of P-I-N diodes, and wherein the first region that is linearly elongated corresponds to a bit line associated with the resistive memory device.

2. The electronic structure of claim 1 wherein the resistive memory device and P-I-N diode are connected in series.

3. The electronic structure of claim 2 wherein the resistive memory device comprises a first electrode, an insulating layer on and in contact with the first electrode, and a second electrode on and in contact with the insulating layer.

4. The electronic structure of claim 1, wherein the body of the P-I-N diode comprises epitaxial material.

5. The electronic structure of claim 1, wherein the body of the P-I-N diode comprises silicon.

6. A resistive memory array comprising:
 a plurality of bit lines;
 a plurality of word lines; and
 a plurality of memory structure pillars, each connecting a bit line and a word line, each memory structure pillar comprising a resistive memory device and a P-I-N diode in operative association with the resistive memory device, wherein the P-I-N diode comprises a body comprising a first region of a first selected conductivity type, a second region of a second selected conductivity type opposite the first conductivity type, and an intrinsic region between the first and second regions, wherein the first and second regions and the intrinsic region are stacked in a column, wherein the first region is linearly elongated such that the first region forms a first selected conductivity type region of a second P-I-N diode of a linear plurality of P-I-N diodes and each of the first region, the second region and the intrinsic region of each P-I-N diode of the linear plurality of P-I-N diodes are of similar dimensions to each of the first region, the second region, and the intrinsic region of another P-I-N diode of the linear plurality of P-I-N diodes, and wherein the first region that is linearly elongated corresponds to one of the bit lines.

7. The resistive memory array of claim 6 wherein the resistive memory device and P-I-N diode are connected in series.

8. The resistive memory array of claim 7 wherein the resistive memory device comprises a first electrode, an insulating layer on and in contact with the first electrode, and a second electrode on and in contact with the insulating layer.

9. The resistive memory array of claim 6, wherein the plurality of memory structure pillars are arrayed such that each memory structure pillar of the plurality of memory structure pillars is separated from other memory structure pillars by a width of a memory structure pillar.

10. An electronic structure comprising:
 a pair of resistive memory devices; and
 a pair of P-I-N diodes, a P-I-N diode of the pair of P-I-N diodes in operative association with a respective resistive memory device of the pair of resistive memory devices, wherein the electronic structure is a pillar, wherein a P-I-N diode of the pair of P-I-N diodes comprises a body comprising a first region of a first conductivity type, a second region of a second conductivity type opposite the first conductivity type, and an intrinsic region between the first and second regions, wherein the first and second regions and the intrinsic region are stacked in a column, and wherein the first region is linearly elongated such that the first region forms a first selected conductivity type region of a second P-I-N diode of a linear plurality of P-I-N diodes and each of the first region, the second region and the intrinsic region of each P-I-N diode of the linear plurality of P-I-N diodes are of similar dimensions to each of the first region, the second region, and the intrinsic region of another P-I-N diode of the linear plurality of P-I-N diodes, and wherein the first region that is linearly elongated corresponds to a bit line associated with the resistive memory devices.

11. The electronic structure of claim 10 wherein the resistive memory device and P-I-N diode are connected in series.

12. The electronic structure of claim 10 wherein the resistive memory device comprises a first electrode, an insulating layer on and in contact with the first electrode, and a second electrode on and in contact with the insulating layer.

* * * * *